(12) United States Patent
Wu et al.

(10) Patent No.: US 12,557,697 B2
(45) Date of Patent: Feb. 17, 2026

(54) DISPLAY PANEL AND DISPLAY DEVICE

(71) Applicant: Shanghai Tianma Microelectronics Co., Ltd., Shanghai (CN)

(72) Inventors: Yaodong Wu, Shanghai (CN); Yang Zeng, Shanghai (CN)

(73) Assignee: SHANGHAI TIANMA MICROELECTRONICS CO., LTD., Shanghai (CN)

(*) Notice: Subject to any disclaimer, the term of this patent is extended or adjusted under 35 U.S.C. 154(b) by 884 days.

(21) Appl. No.: 17/838,309

(22) Filed: Jun. 13, 2022

(65) Prior Publication Data
US 2023/0317696 A1 Oct. 5, 2023

(30) Foreign Application Priority Data
Mar. 31, 2022 (CN) .......................... 202210329223.7

(51) Int. Cl.
H01L 25/16 (2023.01)
H01L 23/00 (2006.01)
H10H 20/851 (2025.01)
H10H 20/857 (2025.01)

(52) U.S. Cl.
CPC ............ H01L 25/167 (2013.01); H01L 24/13 (2013.01); H01L 24/14 (2013.01); H10H 20/857 (2025.01); H01L 24/05 (2013.01); H01L 24/16 (2013.01); H01L 2224/05573 (2013.01); H01L 2224/13007 (2013.01); H01L 2224/1403 (2013.01); H01L 2224/16145 (2013.01); H01L 2224/16506 (2013.01); H10H 20/8515 (2025.01)

(58) Field of Classification Search
CPC ....... H01L 25/167; H01L 24/13; H01L 24/14; H01L 24/05; H01L 24/16; H01L 2224/05573; H01L 2224/13007; H01L 2224/1403; H01L 2224/16145; H01L 2224/16506; H10H 20/857; H10H 20/8515
See application file for complete search history.

(56) References Cited

U.S. PATENT DOCUMENTS
2024/0014366 A1* 1/2024 Huo ...................... H01L 25/167

FOREIGN PATENT DOCUMENTS
CN 114038840 A 2/2022

OTHER PUBLICATIONS
Su et al., CN 111430403, Jul. 17, 2020 (Year: 2020).*
Dai et al., CN 111769108, Oct. 13, 2020 (Year: 2020).*
Yamazaki et al., CN 112639937, Apr. 9, 2021 (Year: 2021).*
Yu, CN 113921578, Jan. 11, 2022 (Year: 2022).*
The First Office Action and search report dated Jun. 17, 2025 for Chinese Application No. 202210329223.7, 19 pages.

* cited by examiner

Primary Examiner — Mary Ellen Bowman
(74) Attorney, Agent, or Firm — East IP P.C.

(57) ABSTRACT

The present application describes a display panel and a display device. The display panel according to the present application includes: an array substrate; and a plurality of pixels, the pixels including light-emitting elements; wherein the light-emitting element is located at a side of the array substrate and includes a light-emitting region and a non-light-emitting region; and wherein at least two of the light-emitting elements are arranged in different manners.

15 Claims, 13 Drawing Sheets

DISPLAY PANEL AND DISPLAY DEVICE

CROSS-REFERENCE TO RELATED APPLICATION

The present application claims priority to Chinese Patent Application No. 202210329223.7, filed on Mar. 31, 2022, which is incorporated herein by reference in its entirety.

TECHNICAL FIELD

The present application relates to the field of display technology, and in particular to a display panel and a display device.

BACKGROUND

With continuous development of display technologies, display panels have been widely used in people's production and life activities. However, the display panel in the related art still has some technical problems such as pixel crosstalk, which affect a display effect of the display panel and should be solved.

SUMMARY

In view of the above, the present application provides a display panel and a display device.

The display panel according to the present application includes: an array substrate; and a plurality of pixels, the pixels including light-emitting elements; wherein the light-emitting element is located at a side of the array substrate and includes a light-emitting region and a non-light-emitting region; and wherein at least two of the light-emitting elements are arranged in different manners.

The present application further provides a display device which includes the above-described display panel.

With the present application, a display effect of a display panel can be improved.

DETAILED DESCRIPTION

Figure 1:
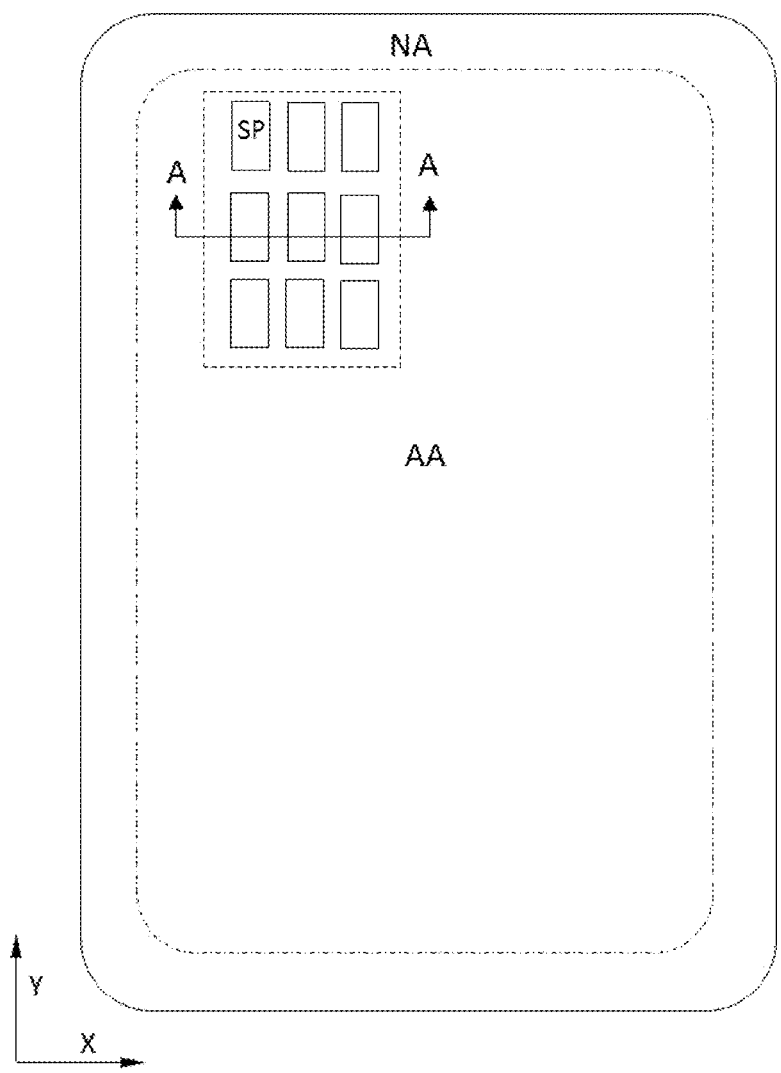
FIG. 1 is a top view of a display panel according to an embodiment of the present application.

In order to make the above objects, features and advantages of the present application clearer and easier to be understood, the present application will be further described below with reference to accompanying drawings and embodiments.

It should be noted that specific details are set forth in the following description in order to facilitate a thorough understanding of the present application. However, the present application can be implemented in many other ways different from those described herein, and those skilled in the art can make modifications similarly without departing from concepts of the present application. Accordingly, the present application is not limited by specific embodiments described below.

The terms as used in the embodiments of the present application are described only for the purpose of describing specific embodiments, and are not intended to limit the present application. The terms "a", "an" and "the" in the singular form as used in the embodiments of the present application and the appended claims are intended to include the plural form thereof as well, unless it is clearly dictated otherwise.

It should be noted that the orientational terms such as "up", "down", "left" and "right" as described in the embodiments of the present application are provided by reference to those shown in the drawings, and should not be construed to limit the embodiments of the present application. Also, in this context, it should also be noted that when an element is referred to as being formed "on" or "under" another element, it not only may be directly formed "on" or "under" the another element, but also may be indirectly formed "on" or "under" the another element through an intermediate element.

Also, the example implementations can be implemented in various forms and should not be construed as being limited to the implementations set forth herein; rather, these implementations are descried to make the present application more thorough and complete, and fully convey concepts of the example embodiments to those skilled in the art. The same reference numerals in the drawings denote the same or similar structures, and thus repeated descriptions therefor will be omitted. The terms expressing positions and orientations as described in the present application are all described by taking those in the accompanying drawings as an example, but changes can also be made as required, and all of the changes fall within the protection scope of the present application. The drawings of the present application are provided only for illustrating relative positional relationships, and the thickness of layers in some parts may be drawn in an exaggerated manner to facilitate understanding, and the thicknesses of layers in the drawings do not represent a proportional relationship between thicknesses of actual layers. Also, the embodiments of the present application and features of the embodiments may be combined with each other without conflicts. The drawings for the various embodiments in the present application use the same reference numerals. In addition, similarities between the embodiments will not be repeated herein.

Figure 2:
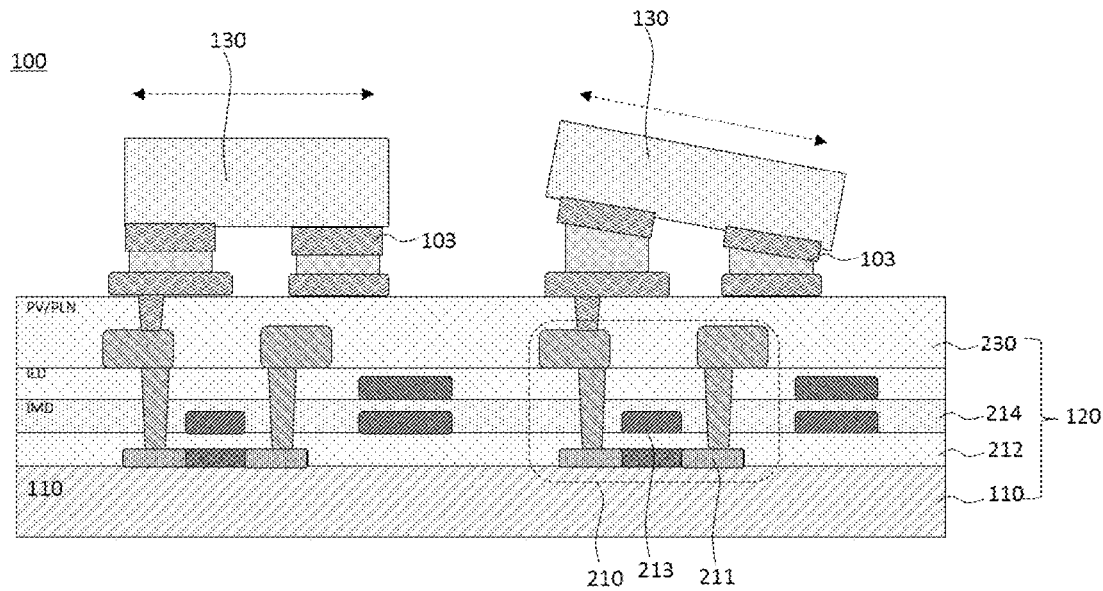
FIG. 2 is a partial cross-sectional view along a direction A-A in FIG. 1.

Please refer to FIG. 1 and FIG. 2. FIG. 1 is a top view of a display panel according to an embodiment of the present application, and FIG. 2 is a partial cross-sectional view along a direction A-A in FIG. 1, where the cross-section is perpendicular to a plane where the display panel is located.

In some embodiments, the display panel 100 comprises a display area AA and a non-display area NA surrounding the display area AA. It should be understood that the dotted border line in FIG. 1 is used to indicate a boundary between the display area AA and the non-display area NA. The display area AA is an area of the display panel for displaying pictures and generally includes a plurality of pixels sp arranged in an array, and the pixels sp include their respective light-emitting elements (e.g., diodes) and control elements (e.g., thin films transistor which constitute pixel driving circuits). The non-display area NA surrounds the display area AA, and generally includes peripheral driving elements, peripheral wirings, and a fan-out area.

In some embodiments, the display panel 100 includes an array substrate 120.

In some embodiments, the array substrate 120 includes a substrate 110.

In some embodiments, the substrate 110 may be made of polymeric materials such as glass, polyimide (PI), polycarbonate (PC), polyethersulfone (PES), polyethylene terephthalate (PET), polyethylene naphthalate (PEN), polyarylate (PAR), or fiberglass reinforced plastic (FRP), and the like. The substrate 110 may be transparent, translucent or opaque.

In some embodiments, the substrate 110 may be flexible or rigid. It should be noted that in the embodiments of the present application, a layer being located "on" a reference layer can be understood as it being located "at a side of the reference layer away from the substrate", and unless otherwise specified, the term "on" only indicates an orientational relationship and does not mean that the two layers are necessarily adjacent or in contact with each other.

In some embodiments, the array substrate 120 may further include a buffer layer (not shown in the figure) on the substrate 110, and the buffer layer may cover the entire upper surface of the substrate 110.

In some embodiments, the array substrate 120 further includes pixel circuits and driving modules for controlling light-emitting elements 130.

Specifically, the array substrate 120 includes a plurality of pixel circuits located in the display area AA and driving modules located in the non-display area NA. In some embodiments, the pixel circuits and the driving modules are located at a side of the substrate 110 facing a display surface or a touch surface of the display panel 100.

The array substrate 120 may further include a plurality of thin film transistors 210 (Thin Film Transistor, TFT), which constitute the pixel circuits for controlling light emission of the light-emitting element 130.

The structures in the embodiments of the present application are described by taking top-gate thin film transistors as an example. The layer of the thin film transistors 210 includes: an active layer 211 on the substrate 110. The active layer 211 may be made of an amorphous silicon material, a polysilicon material, or a metal oxide material, or the like. In the case where the active layer 211 is made of a polycrystalline silicon material, it may be formed by using a low temperature amorphous silicon technology, that is, the amorphous silicon material is melted by a laser to form a polycrystalline silicon material. In addition, various methods such as rapid thermal annealing (RTA), solid phase crystallization (SPC), excimer laser annealing (ELA), metal-induced crystallization (MIC), metal-induced lateral crystallization (MILC), or continuous lateral curing (SLS) can also be used. The active layer 211 further includes a source region and a drain region formed by doping N-type impurity ions or P-type impurity ions, and a channel region between the source region and drain region.

A gate insulating layer 212 is provided on the active layer 211. The gate insulating layer 212 includes an inorganic layer such as silicon oxide or silicon nitride, and may include a single layer or multiple layers.

A gate electrode 213 is provided on the gate insulating layer 212. The gate electrode 213 may include a single layer or multiple layers of gold (Au), silver (Ag), copper (Cu), nickel (Ni), platinum (Pt), palladium (Pd), aluminum (Al), molybdenum (MO), or chromium (Cr), or alloys such as an aluminum (Al): neodymium (Nd) alloy and an molybdenum (MO): tungsten (W) alloy.

An interlayer insulating layer 214 is provided on the gate electrode 213. The interlayer insulating layer 214 may be made of an inorganic insulating material such as silicon oxide or silicon nitride. Certainly, in some other embodiments of the present application, the interlayer insulating layer may be made of an organic insulating material.

A source electrode and a drain electrode are provided on the interlayer insulating layer 214. The source electrode and the drain electrodes are respectively electrically connected (or bonded) to the source region and the drain region through contact vias, which are formed by selectively removing the gate insulating layer 212 and the interlayer insulating layer 214.

The array substrate 120 may further include a passivation layer (not shown in the figure). In some embodiments, the passivation layer is located on the source electrode and the drain electrode of the thin film transistor 210. The passivation layer may be made of an inorganic material such as silicon oxide or silicon nitride, or may be made of an organic material.

The array substrate 120 may further include a planarization layer 230. In some embodiments, the planarization layer 230 is disposed on the passivation layer. The planarization layer 230 includes an organic material such as acrylic, polyimide (PI) or benzocyclobutene (BCB), and the planarization layer has a planarization effect.

In some embodiments, the display panel 100 includes a plurality of pixels sp.

In some embodiments, the pixels sp include light-emitting elements 130.

In some embodiments, the light-emitting elements 130 are disposed at a side of the array substrate 120 and are electrically connected to the array substrate 120.

Specifically, the light-emitting elements 130 are disposed at a side of the array substrate 120 away from the substrate 110, and are electrically connected to the pixel circuits in the array substrate 120.

In some embodiments, the light-emitting element 130 may be a micro light-emitting diode (Micro Light-Emitting Diode, Micro-LED). Using Micro-LED as the light-emitting element 130, lifespan of the display panel can be effectively improved, power consumption of the display panel can be reduced, response time of the display panel can be reduced, and viewing angle of the display panel can be increased.

In some embodiments, at least two of the light-emitting elements 130 are arranged in different manners.

It should be noted that the light-emitting elements 130 being arranged in different manners in the embodiment indicates that the light-emitting elements 130 have different degrees of inclination with respect to the plane where the display panel is located. In this way, mutual interference of outgoing light from light-emitting elements 130 of different pixels can be avoid.

Next, the embodiments of the present application will be described by taking the light-emitting element 130 being an Micro-LED as an example.

Figure 3:
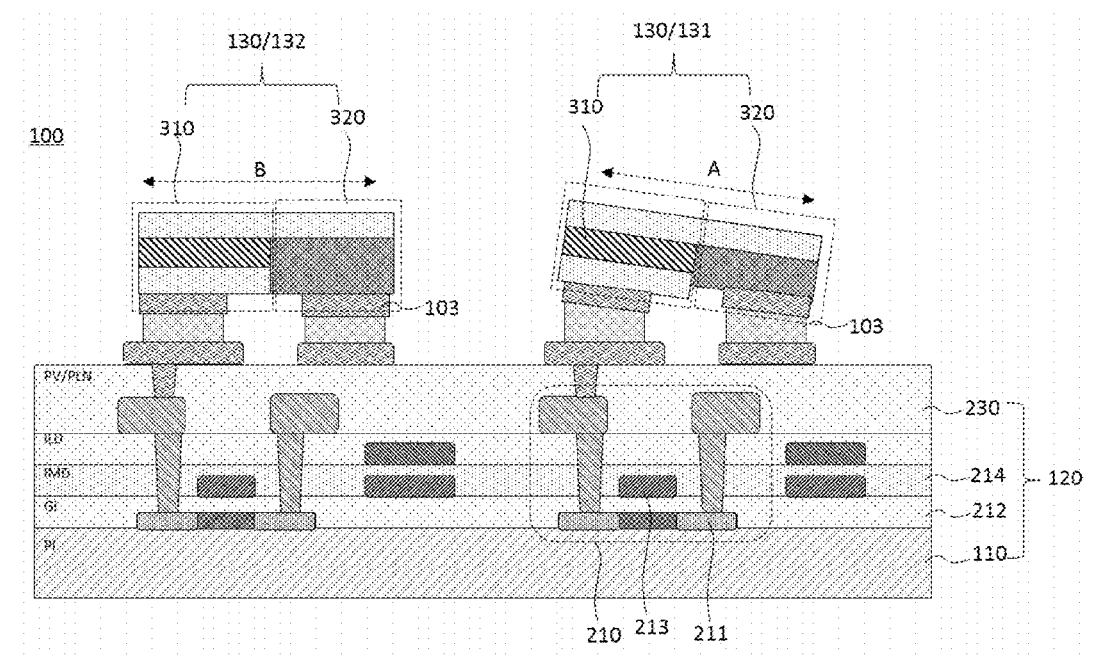
FIG. 3 is another partial cross-sectional view of a display panel according to an embodiment of the present application along the direction A-A in FIG. 1.

As shown in FIG. 3, FIG. 3 is another partial cross-sectional view of the display panel according to an embodiment of the present application along the direction A-A in FIG. 1.

In some embodiments, the Micro-LED has a size smaller than 100 μm.

In some embodiments, the light-emitting element 130 includes a first semiconductor layer, a quantum well layer and a second semiconductor layer which are stacked in layers, and the quantum well layer is located between the first semiconductor layer and the second semiconductor layer. The light-emitting element 130 further includes an electrode layer 103. In some embodiments, in the embodiment, the electrode layer 103 is located at a side of the light-emitting element 130 close to the pixel circuit. The electrode layer 103 at least includes two electrodes; and the two electrodes are respectively connected with the first semiconductor layer and the second semiconductor layer.

In some embodiments, the electrode layer 103 of the light-emitting element includes a first electrode and a second electrode, and the first electrode and the second electrode are a positive electrode and a negative electrode of the light-emitting element respectively (i.e. N electrode and P electrode; also referred to as cathode and anode). The first semiconductor layer is located at a side of the second semiconductor layer close to the pixel circuit; the first electrode is located at a side of the first semiconductor layer close to the pixel circuit, and the second electrode is located at a side of the second semiconductor layer close to the pixel circuit.

In some embodiments, the light-emitting element 130 includes a light-emitting region 310 and a non-light-emitting region 320.

In some embodiments, the light-emitting region 310 includes a region where the first semiconductor layer, the quantum well layer and the second semiconductor layer are stacked. The non-light-emitting region 320 includes a region where the second electrode and the second semiconductor layer are stacked.

In some embodiments, the light-emitting regions 310 and the non-light-emitting regions 320 of at least two of the light-emitting elements 130 are arranged in different manners.

It should be noted that the different arrangement of the light-emitting elements 130 in the embodiment means that the light-emitting elements 130 are measured by orientational relationships between the light-emitting region 310 and the non-light-emitting region 320. That is, the orientational relationships between the light-emitting region 310 and the non-light-emitting region 320 are different.

With the embodiment, it enables light outputs from the display panel to be uniform, and prevents a problem of crosstalk from occurring locally and intensively to make it invisible to eyes of a user.

For example, as shown in FIG. 3, there are at least two different arrangement directions in arrangement of the light-emitting region 310 and the non-light-emitting region 320, and the two directions are not parallel. At least one of the directions is not parallel to a plane where the display panel is located.

In other words, in a direction from one light-emitting element 130 to the other light-emitting element 130, one of the light-emitting elements 130 is inclined with respect to the other light-emitting element 130.

In an example, the light-emitting elements 130 include a first light-emitting element 131 and a second light-emitting element 132.

In some embodiments, the light-emitting region 310 and the non-light-emitting region 320 of the first light-emitting element 131 are arranged along the direction A, and the light-emitting region 310 and the non-light-emitting region 320 of the second light-emitting element 132 are arranged along the direction B. More specific embodiments will be described below, and are not repeated here.

Figure 4:
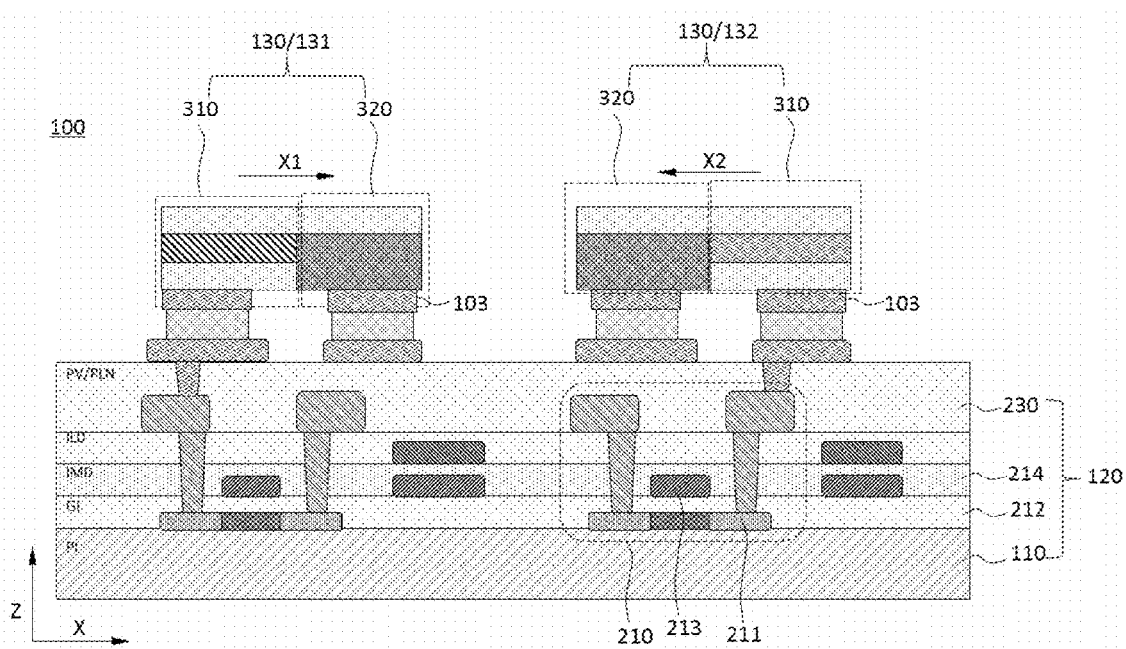
FIG. 4 is another partial cross-sectional view of a display panel according to an embodiment of the present application along the direction A-A in FIG. 1.

In another example, as shown in FIG. 4, FIG. 4 is another partial cross-sectional view of the display panel according to an embodiment of the present application along the direction A-A in FIG. 1.

In some embodiments, a space between at least two of the light-emitting elements 130 may be larger or smaller than a space between the light-emitting regions of the two light-emitting elements.

In some embodiments, the "space" refers to a distance between centers of orthographic projections of the two structures on the plane where the display panel is located. The "center" can be understood as a geometric center of the orthographic projection of the structure on the plane where the display panel is located.

That is, the light-emitting elements 130 being arranged in different manners in the embodiment means that the two light-emitting elements 130 have different arrangement directions for the light-emitting region 310 and the non-light-emitting region 320.

In some embodiments, the two light-emitting elements 130 may have opposite arrangement directions for the light-emitting region 310 and the non-light-emitting region 320. That is, there are at least two different arrangement directions for arrangement of the light-emitting region 310 and the non-light-emitting region 320, and the two directions are parallel but opposite to each other.

For example, the light-emitting elements 130 includes the first light-emitting element 131 and the second light-emitting element 132 that are sequentially arranged along an X1 direction which is parallel to the first direction X. In some embodiments, the light-emitting region 310 and the non-light-emitting region 320 of the first light-emitting element 131 are sequentially arranged along the X1 direction, and the light-emitting region 310 and the non-light-emitting region 320 of the second light-emitting element 132 are sequentially arranged along the X2 direction. More specific embodiments will be described below and will not be repeated here.

Figure 5:
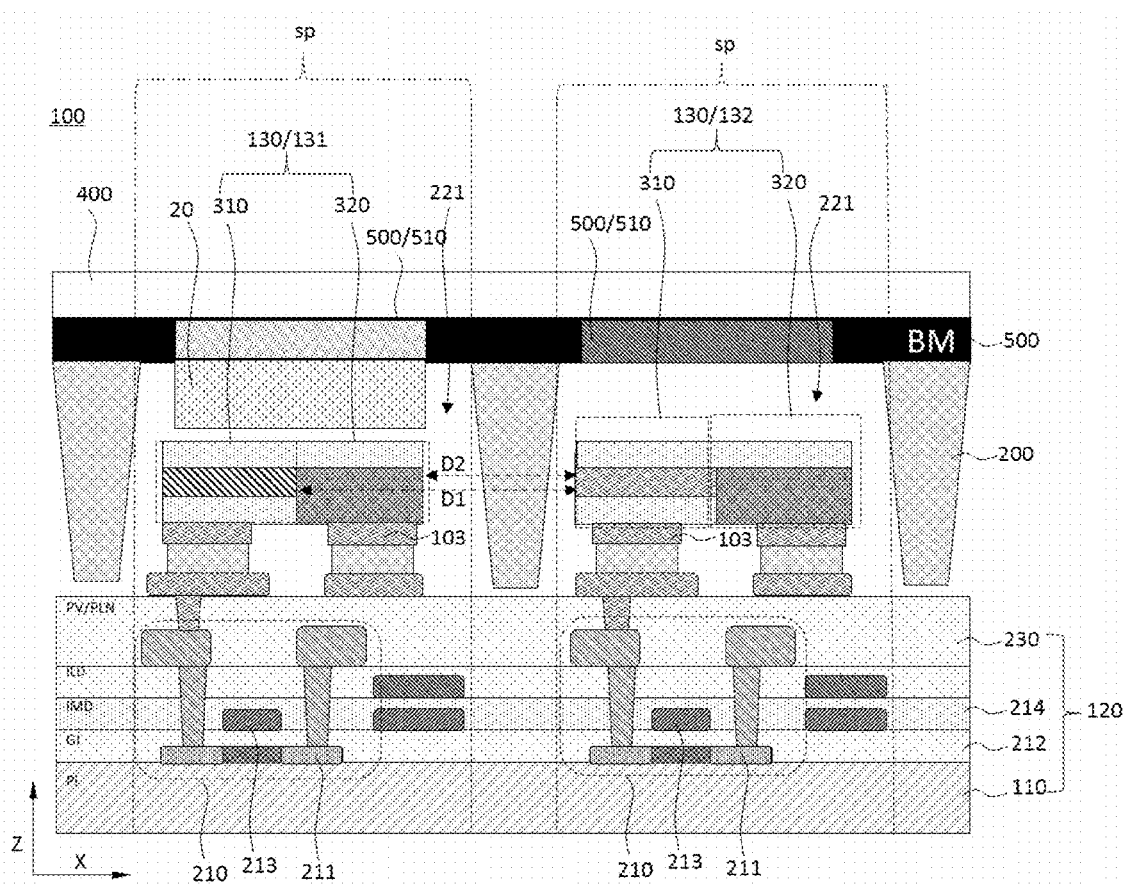
FIG. 5 is another partial cross-sectional view of a display panel according to an embodiment of the present application along the direction A-A in FIG. 1.

As shown in FIG. 5, FIG. 5 is another partial cross-sectional view of the display panel according to an embodiment of the present application along the direction A-A in FIG. 1.

In some embodiments, the display panel 100 may further include a color conversion layer 20, which is located at a side of the light-emitting element 130 away from the array substrate 120.

In some embodiments, the color conversion layer 20 includes quantum dots. The quantum dots may also be called as nano-crystal grains or nanoparticles, which generally have a particle size ranging from 1 nm to 10 nm; and the nanoparticles are converted from a continuous energy band structure with quantum confinement of electrons and holes to a discrete energy level structure with molecular characteristics, so can be excited to emit fluorescence. An emission spectrum of the quantum dots can be controlled by changing the size of the quantum dots. By changing the size of the quantum dots and the chemical composition, it is possible to enable the emission spectrum to cover an entire visible light region with a broad excitation spectrum and a narrow emission spectrum, and thus a higher spectral coverage is achieved.

Certainly, in some other embodiments of the present application, the color conversion unit includes a fluorescent material, such as organic fluorescent powders, which will not be repeated here.

In some embodiments, the light-emitting elements 130 may be light-emitting elements for emitting light of first color. That is, the light-emitting elements 130 included in pixels sp of different colors may emit light of the same color and the emitted lights are all of the first color.

In some embodiments, the color conversion layer 20 corresponding to a pixel sp is configured to convert the light of first color into light of a color corresponding to the pixel sp.

Specifically, the color conversion layer 20 may include a plurality of units, which are respectively arranged correspondingly to different pixels sp.

In some embodiments, the display panel 100 includes a plurality of pixels sp of different colors. The pixels sp are arranged as an array in the display area AA. Some pixel sp includes a pair of a light-emitting element 130 and a unit of the color conversion layer 20 which are disposed correspondingly. Pixels sp of different colors include color conversion layers 20 with different light-emitting colors; incident lights can be converted into lights with a specific color after passing through the color conversion layer 20, so that the pixel sp emits lights of the corresponding color.

In some embodiments, in the embodiments of the present application, the color conversion layers 20 included in pixels sp of different colors have different colors of output lights. For example, for a display panel using a display technology with three colors, i.e. RGB, a color conversion layer having red output lights is selected for a position corresponding to a red pixel, a color conversion layer having green output lights is selected for a position corresponding to a green pixel, and a color conversion layer having output lights is selected for a position corresponding to a blue pixel.

In some embodiments, for a pixel sp of the first color, a color conversion layer 20 may not be provided correspondingly.

For example, light-emitting elements that emit blue lights are provided at respective positions of a red pixel, a green pixel and a blue pixel, and the blue lights emitted by the light-emitting elements are converted into red lights and green lights respectively after passing through respective color conversion units of different colors; while there is no need to set a color conversion unit at a position of the blue pixel.

Certainly, in some other embodiments of the present application, the light-emitting elements may uniformly emit white lights, and the white lights emitted by the light-emitting elements are converted into red lights, green lights and blue lights respectively after being converted by color conversion units of respective colors; the embodiment is not repeated here.

With the embodiment, the display effect of the display panel can be further improved.

Still referring to FIG. 5, in some embodiments, the display panel 100 further includes an opposite substrate 400 which is disposed opposite to the array substrate, and includes a plurality of barrier walls 200.

The barrier walls 200 are located at a side of the opposite substrate 400 facing the array substrate 120, and disposed corresponding to respective intervals among the light-emitting elements 130.

Specifically, the barrier walls 200, the light-emitting elements 130 and the color conversion layer 20 are located between the opposite substrate 400 and the array substrate 120.

The light-emitting elements 130 are provided on the array substrate 120 and face the opposite substrate 400.

The barrier walls 200 are provided on the opposite substrate 400 and face the array substrate 120.

The color conversion layer 20 is provided on the opposite substrate 400 and faces the array substrate 120.

In some embodiments, the pixels sp are defined by openings 221 among the barrier walls 200. For example, one pixel sp is defined by one opening 221 between the barrier walls 200.

In some embodiments, the color conversion layer 20 is at least partially located in the openings 221 among the barrier walls 200, and one unit of the color conversion layer 20 corresponds to one of the opening 221 among the barrier walls 200.

In some embodiments, the display panel 100 further includes a color filter layer 500.

The color filter layer 500 includes color resists 510, and the color resists 510 are disposed corresponding to the light-emitting elements 130.

In some embodiments, the color filter layer 500 further includes black matrixes BM, which correspond to intervals among the pixels sp, and the color resists 510 are provided corresponding to openings among the black matrixes BM.

In some embodiments, the color resists 510 correspond to the opening 221 among the barrier walls 200.

It should be understood that a plurality of color resist units having different colors are respectively formed by a plurality of color resists 510, and one color resist unit corresponds to one pixel sp, or in other words, one color resist unit corresponds to one opening 221.

In some embodiments, the color conversion layer 20 is disposed at a side of the color resist 510 close to the array substrate 120.

With the embodiment, the lights emitted by the light-emitting element 130 may first pass through the color conversion layer 20, and then the lights excited by the color conversion layer 20 pass through the color resist 510 having a corresponding color during a subsequent propagation process. The color resist 510 is provided to filter the lights that are not fully excited by the color conversion layer 20 to ensure chromaticity of the lights emitted from the pixel sp.

Still referring to FIG. 5, in some embodiments, the light-emitting elements 130 may include a first light-emitting element 131 and a second light-emitting element 132.

In some embodiments, as shown by the dot-line arrow in FIG. 5, a distance from the light-emitting region of the first light-emitting element 131 to the second light-emitting element 132 is D1; and a distance from the non-light-emitting region of the first light-emitting element 131 to the second light-emitting element 132 is D2; where D1>D2.

That is, regarding the light-emitting region and the non-light-emitting region corresponding to the first light-emitting element, the non-light-emitting region is located at a side of the light-emitting region close to the second light-emitting element. The light-emitting region corresponding to the first light-emitting element is farther away from the second light-emitting element than the non-light-emitting region thereof.

In some embodiments, the first light-emitting element 131 and the second light-emitting element 132 are the light-emitting elements 130 in adjacent pixels sp; that is, the first light-emitting element 131 and the second light-emitting element 132 are arranged adjacently.

With such design, it is possible to keep the light-emitting region of the first light-emitting element away from the second light-emitting element, thereby avoiding an influence of the first light-emitting element on the second light-emitting element.

Further, the first light-emitting element 131 and the second light-emitting element 132 have the same color.

In some embodiments, the color of the first light-emitting element 131 is different from a color of a pixel sp corresponding to the first light-emitting element 131, and the color of the second light-emitting element 132 is the same as a color of a pixel sp corresponding to the second light-emitting element 132.

In some embodiments, there is a color conversion layer 20 for the pixel sp corresponding to the first light-emitting element 131; and there is no color conversion layer 20 for the pixel sp corresponding to the second light-emitting element 132.

In some embodiments, the first light-emitting element 131 is disposed in a green pixel or a red pixel, and the second light-emitting element 132 corresponds to a blue pixel.

With the embodiment, it can be avoided that the lights of the same color from adjacent light-emitting elements cause crosstalk to affect color purity, and NTSC can be reduced. Specifically, it is described by taking the light-emitting element being a blue Micro-LED light-emitting element and the color conversion layer being a quantum dot layer as an example. Since the Micro-LED in a module including a quantum dot color film provides only a source for blue lights, the blue lights in the R and G pixels may easily cause crosstalk in the adjacent blue pixel, and when emitted from the blue pixel, will cause reduction of color purity for display.

With the embodiment, since the Micro-LED emits lights only at one electrode position, the electrode for emitting lights is kept away from the blue pixel, that is, the light-emitting region of a light-emitting element for a non-blue pixel is kept away from the blue pixel, which reduces a light-receiving angle from which the adjacent blue pixel is illuminated and prevents lights from the light-emitting elements corresponding to the R and G pixels entering the blue pixel, and thereby an effect of reduction of crosstalk and increase of color purity can be achieved.

Figure 6:
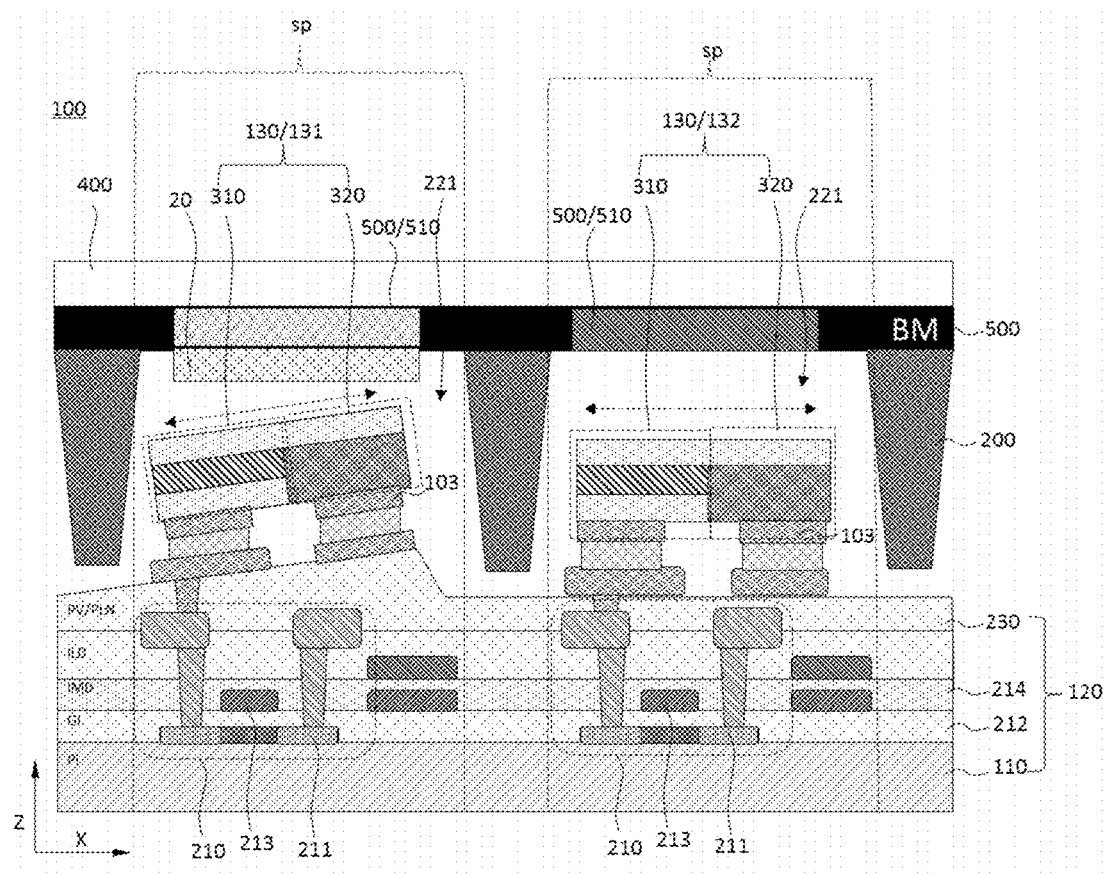
FIG. 6 is another partial cross-sectional view of a display panel according to an embodiment of the present application along the direction A-A in FIG. 1.

As shown in FIG. 6, FIG. 6 is another partial cross-sectional view of the display panel according to an embodiment of the present application along the direction A-A in FIG. 1.

The light-emitting elements 130 include a first light-emitting element 131 and a second light-emitting element 132.

A plane where the light-emitting region 310 of the first light-emitting element 131 is not parallel to a plane where the display panel 100 is located, and a top surface of the light-emitting region 310 of the first light-emitting element 131 is inclined such that the top surface of the light-emitting region 310 is disposed away from the second light-emitting element 132.

As an example, in a direction from the first light-emitting element 131 to the second light-emitting element 132, the light-emitting region of the first light-emitting element 131 is inclined toward a direction away from the array substrate 120, as shown in the FIG. 6.

With such a design, the light-emitting region of at least one of the two light-emitting elements can be inclined such that a top surface of the light-emitting region is disposed away from the other light-emitting element, for example, the top surface of the light-emitting region of the first light-emitting element 131 is disposed away from the second light-emitting element 132, so that crosstalk between the adjacent light-emitting elements can be avoided. It should not be understood that the example is provided to illustrate the embodiments of the present application, and the present application is not limited to the specific embodiments described here, and the light-emitting region of a light-emitting element may be inclined in an different way as long as such inclination results in that light from a top surface of the inclined light-emitting region goes away from the other light-emitting element.

Further, the first light-emitting element 131 and the second light-emitting element 132 may have the same color.

In some embodiments, the color of the first light-emitting element 131 is different from the color of a pixel sp corresponding to the first light-emitting element 131, and the color of the second light-emitting element 132 is the same as the color of a pixel sp corresponding to the second light-emitting element 132.

In some embodiments, there is a color conversion layer 20 for the pixel sp corresponding to the first light-emitting element 131; and there is no color conversion layer 20 for the pixel sp corresponding to the second light-emitting element 132.

In some embodiments, the first light-emitting element 131 is disposed in a green pixel or a red pixel, and the second light-emitting element 132 corresponds to a blue pixel.

With the embodiment, at least one of two adjacent light-emitting elements of the same color can be inclined such that a top surface of the light-emitting region is disposed away from the other light-emitting element, so as to avoid light of the same color in crosstalk from the adjacent light-emitting elements from affecting color purity and reducing NTSC. Specifically, it is described by taking the light-emitting element being a blue Micro-LED light-emitting element and the color conversion layer being a quantum dot layer as an example. Since the Micro-LED in a module including a quantum dot color film provides only a source for blue lights, the blue lights in the R and G pixels may easily cause crosstalk in the adjacent blue pixel, and when emitted from the blue pixel, will cause reduction of color purity for display. With the embodiment, since the light-emitting region of the light-emitting element in a pixel adjacent to the blue pixel is inclined such that a top surface of the light-emitting region is disposed away from the blue pixel, a main light-emitting direction of the light-emitting element after inclination of the light-emitting region is not directed to the blue pixel, which reduces a light-receiving angle from which the adjacent blue pixel is illuminated and prevents lights from the light-emitting elements corresponding to the R and G pixels entering the blue pixel, and thereby an effect of reduction of crosstalk and increase of color purity can be achieved.

Certainly, in some other embodiments of the present application, for example, as shown in FIG. 2, in some embodiments, the light-emitting elements 130 include a first light-emitting element 131 and a second light-emitting element 132.

A plane where the first light-emitting element 131 is located is not parallel to a plane where the display panel 100 is located, and a top surface of the first light-emitting element 131 is inclined such that a top surface of the light-emitting element is disposed away from the second light-emitting element. It should be noted that what is inclined in the embodiment is the entire light-emitting element instead of the light-emitting region of the light-emitting element. As an example, in a direction from the first light-emitting element 131 to the second light-emitting element 132, the entire top surface of the first light-emitting element 131 is inclined toward a direction away from the array substrate 120.

It should be understood that the top surface of the light-emitting element or the top surface of the light-emitting region mentioned in the application is a surface of the light-emitting element or the light-emitting region that is away from the substrate.

With such a design, at least one of the two light-emitting elements can be inclined such that a top surface of the light-emitting element is disposed away from the other light-emitting element, for example, the top surface of the first light-emitting element 131 is inclined such that a top surface of the light-emitting element 131 is disposed away from the second light-emitting element 132, so that crosstalk between the adjacent light-emitting elements can be avoided.

Further, regarding the light-emitting region 310 and the non-light-emitting region 320 corresponding to the first light-emitting element 131, the non-light-emitting region 320 is located at a side of the light-emitting region 310 close to the second light-emitting element.

With such a design, since the first light-emitting element 131 is entirely inclined such that the entire top surface of the light-emitting element 131 is disposed away from the second light-emitting element 132, the non-light-emitting region 320 of the first light-emitting element 131 is closer to the second light-emitting element 132 and further away from the array substrate 120 than the light-emitting region 310 of the first light-emitting element 131. Therefore, the non-light-emitting region 320 can be used to better block interferential outgoing light from the first light-emitting element toward a pixel for which the second light-emitting element 132 is provided in possible light-emitting paths of the first light-emitting element 131.

Figure 7:
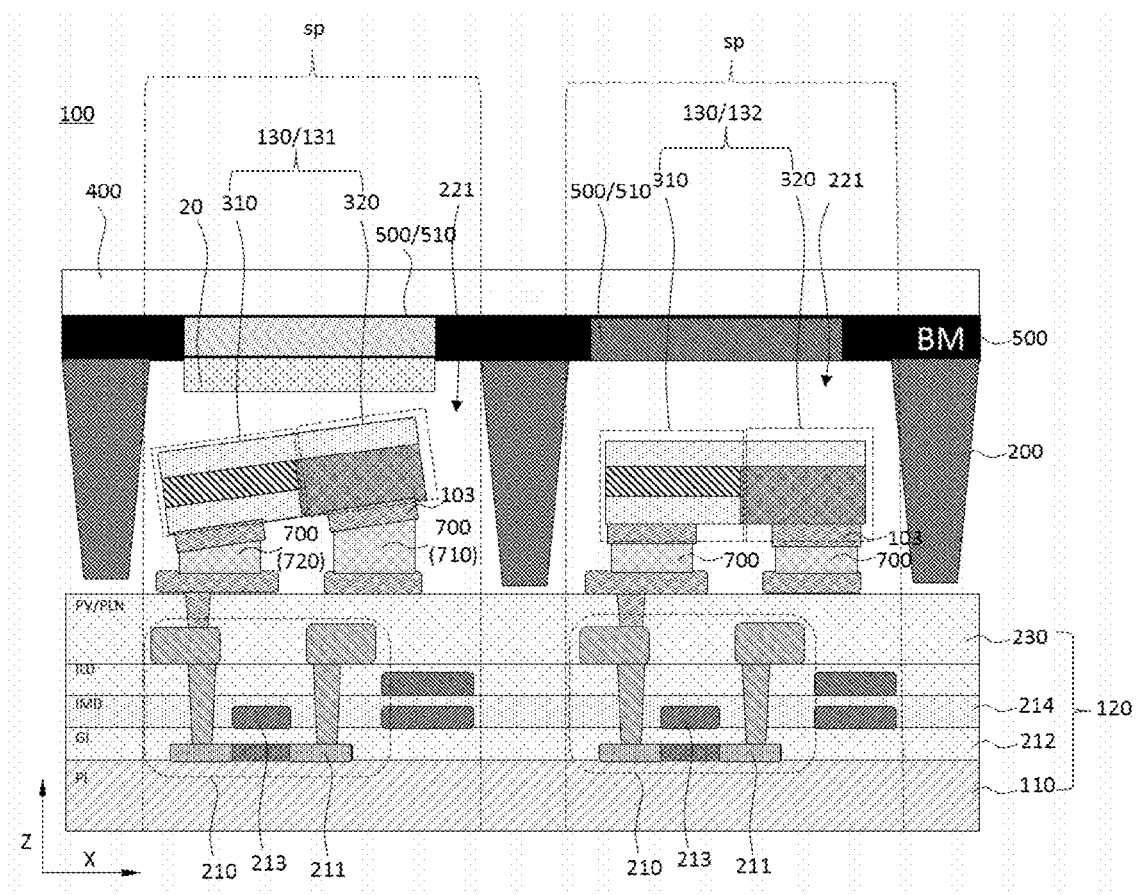
FIG. 7 is another partial cross-sectional view of a display panel according to an embodiment of the present application along the direction A-A in FIG. 1.

As shown in FIG. 7, FIG. 7 is another partial cross-sectional view of the display panel according to an embodiment of the present application along the direction A-A in FIG. 1.

The display panel 100 further includes a support part 700, which is located between the light-emitting element 130 and the array substrate 120.

In some embodiments, the support part 700 is configured to support the light-emitting element 130 on the array substrate 120 and connect the light-emitting element 130 and the array substrate 120.

In some embodiments, the light-emitting elements 130 include a first light-emitting element 131 and a second light-emitting element 132.

The support part 700 includes a first support part 710 and a second support part 720.

In some embodiments, a group of support parts 700 includes at least one first support part 710 and at least one second support part 720. At least one light-emitting element 130 corresponds to a group of a first support part 710 and a second support part 720. For example, the first light-emitting element 131 is connected to the array substrate 120 through a group of support parts 700; the second light-emitting element 132 is connected to the array substrate 120 through another group of support parts 700.

In some embodiments, in the group of support parts 700 corresponding to the first light-emitting element 131: the first support part 710 is located at a side of the second support part 720 close to the second light-emitting element 132, and the first support part 710 is higher than the second support part 720.

With such a design, the top surface of the first light-emitting element 131 can be inclined such that the top surface of the first light-emitting element 131 is disposed away from the second light-emitting element. As an example, in a direction from the first light-emitting element 131 toward the second light-emitting element 132, the top surface of the first light-emitting element 131 is inclined toward a direction away from the array substrate 120.

In some embodiments, the support part may be opaque to light.

In this way, since inclination of the top surface of the first light-emitting element toward a direction away from the array substrate 120 is ensured by support by the support part, it can further prevent a bottom surface of the light-emitting region of the first light-emitting element from emitting crosstalk light toward a pixel where the second light-emitting element is located.

In addition, the inventors of the present application have further studied and found that after the first light-emitting element is turned on, light emitted by the first light-emitting element easily causes crosstalk to a pixel corresponding to the adjacent second light-emitting element through a gap between bottom of the barrier wall and the array substrate. The first support part is located at a side of the second support part close to the second light-emitting element, and the first support part is higher than the second support part, that is, the first support part has an increased height, so an influence of the light emitted from the first light-emitting element on the second light-emitting element can be further avoided.

In some embodiments, still referring to FIG. 7, in the light-emitting region 310 and the non-light-emitting region 320 corresponding to the first light-emitting element 131, the non-light-emitting region 320 is located at a side of the light-emitting region 310 close to the second light-emitting element.

In some embodiments, the first light-emitting element and the second light-emitting element have the same color.

In some embodiments, the color of the first light-emitting element is the same as the color of a pixel corresponding to the first light-emitting element, and the color of the second light-emitting element is different from the color of a pixel corresponding to the second light-emitting element.

In some embodiments, there is no color conversion layer for the pixel sp corresponding to the first light-emitting element; there is a color conversion layer for the pixel sp corresponding to the second light-emitting element. For example, the first light-emitting element corresponds to a green pixel or a red pixel, and the second light-emitting element corresponds to a blue pixel.

With the embodiment, since the entire top surface of the first light-emitting element 131 is inclined such that the entire top surface of the first light-emitting element 131 is disposed away from the second light-emitting element 132, the non-light-emitting region 320 of the first light-emitting element 131 is closer to the second light-emitting element 132 and further away from the array substrate 120 than the light-emitting region 310 of the first light-emitting element 131; therefore, the non-light-emitting region 320 can be used to better block interferential outgoing light from the first light-emitting element toward a pixel for which the second light-emitting element 132 is provided in possible light-emitting paths of the first light-emitting element 131.

Furthermore, the inventors of the present application have further studied and found that after a pixel adjacent to the blue pixel is turned on, the light emitted by the Micro-LED in the pixel easily causes crosstalk to the blue pixel through a gap between the bottom of the barrier wall and the array substrate. Therefore, in some embodiments, the support part may be opaque to light. In this way, since the non-light-emitting region of the first light-emitting element has an increased height due to support by the support part, it can further prevent the bottom surface of the light-emitting region of the first light-emitting element from emitting crosstalk light toward the pixel where the second light-emitting element is located.

In some embodiments, the first support part may be higher than the second support part by 0 μm~5 μm. That is, the first support part 710 is higher than the second support part 720 by 0 μm~5 μm.

It should be noted that, unless otherwise specified, the height of the support part mentioned in the application refers to a size of the support part along a direction perpendicular to a plane where the display panel is located.

With the embodiment, it can not only meet requirements that the support part ensures inclination of the light-emitting element, but also meet requirements that the light-emitting element "reduces the light-receiving angle of the adjacent blue pixel"; and it can prevent a light-emitting direction of the light-emitting region from being excessively shifted caused by excessive inclination of the light-emitting element; and moreover, it can further function to block crosstalk through the gap between the bottom of the barrier wall and the array substrate.

In some embodiments, a height of the support part 700 corresponding to the second light-emitting element 132 is the same as a height of the second support part 720 of the first light-emitting element 131.

In some embodiments, the support part 700 corresponding to the second light-emitting element 132 may include a set of support parts, that is, the second light-emitting element 132 corresponds to at least one first support part 710 and at least one second support part 720; wherein the second support part 52 corresponding to the first light-emitting element 131, the first support part 710 corresponding to the second light-emitting element 132 and the second support part 720 corresponding to the second light-emitting element 132 have the same height. The "height" should be understood as a size of respective support parts in a direction perpendicular to the plane where the display panel is located.

In some embodiments, the height of the first support part 710 corresponding to the second light-emitting element 132 and the height of the second support part 720 corresponding to the second light-emitting element 132 are smaller than the height of the first support part 710 corresponding to the first light-emitting element 131.

In some embodiments, the following three directions, i.e. the arrangement direction of the first light-emitting element 131 and the second light-emitting element 132, the arrangement direction of the light-emitting region 310 and the non-light-emitting region 320 of the first light-emitting element 131 and the arrangement directions of the first support part 710 and the second support part 720 corresponding to the first light-emitting element 131 may be the same as each other.

With the embodiment, the overall height of the second light-emitting element 132 can be made smaller than that of the first light-emitting element 131; at least the overall height of the second light-emitting element 132 is smaller than that of the non-light-emitting region 320 of the first light-emitting element 131, so the light from the light-emitting region 310 of the first light-emitting element 131 toward the pixel corresponding to the second light-emitting element 132 can be prevented through the raised non-light-emitting region 320 of the first light-emitting element 131. In addition, light leakage from the second light-emitting element toward the pixel corresponding to the first light-emitting element can be also prevented through the raised non-light-emitting region 320 of the first light-emitting element 131. Thus, the display effect of the display panel can be further improved.

Certainly, in some other embodiments of the present application, inclination of the light-emitting element can be implemented in other ways. For example, as shown in FIG. 6, a raised structure can be provided on the surface of the array substrate, that is, a plurality of raised structures may be additionally provided on the surface of the array substrate which is close to the light-emitting element without changing original structures of the array substrate and the light-emitting element, which can simplify the process and reduce the cost. In some embodiments, the raised structure may be disposed corresponding to one end of the light-emitting element that needs to be raised, and the end of the light-emitting element that needs to be raised is disposed on the raised structure. Alternatively, the raised structure may have an inclined top surface which is in the same inclination direction as that of the light-emitting element, and the light-emitting element is entirely disposed on the raised structure.

Figure 8:
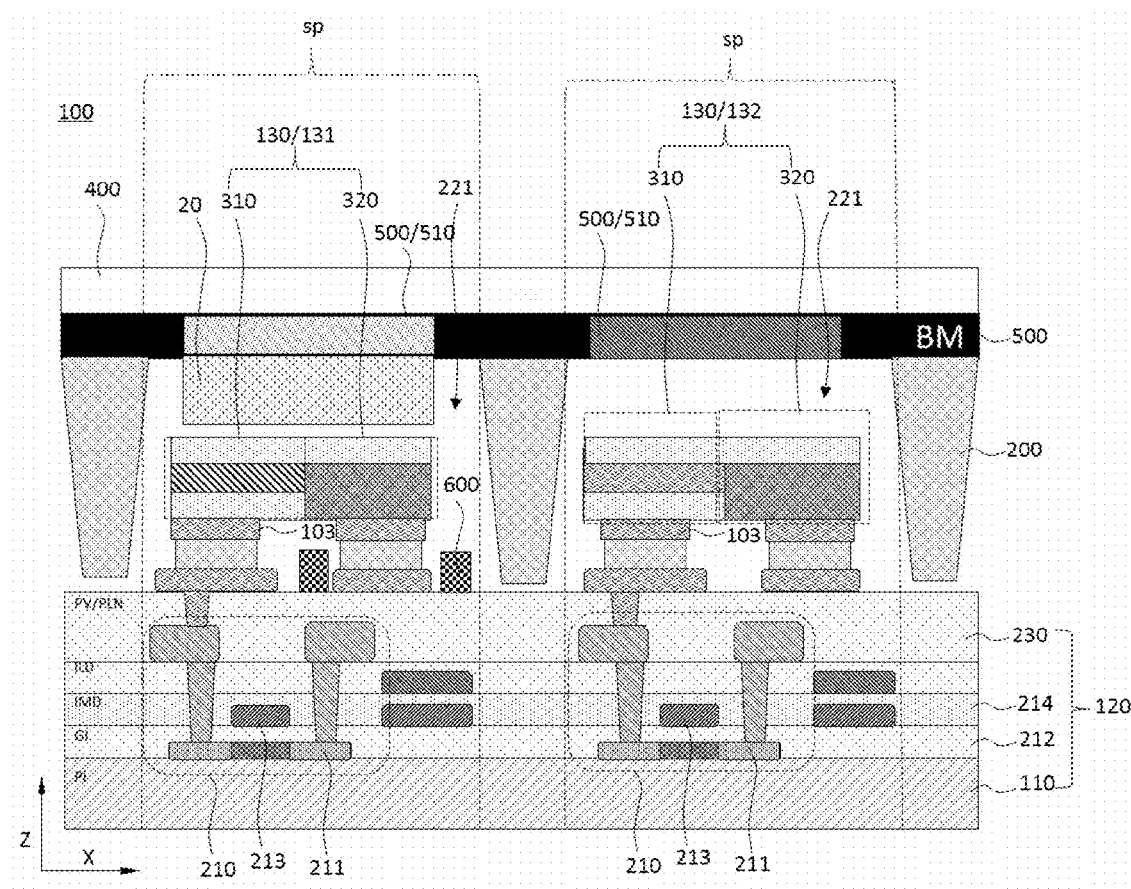
FIG. 8 is another partial cross-sectional view of a display panel according to an embodiment of the present application along the direction A-A in FIG. 1.

As shown in FIG. 8, FIG. 8 is another partial cross-sectional view of the display panel according to an embodiment of the present application along the direction A-A in FIG. 1.

In some embodiments, the display panel 100 further includes a light-shielding part 600 which is located between the light-emitting element 130 and the array substrate 130.

In some embodiments, the light-shielding part 600 may be made of a light-shielding metal material or a black material.

In some embodiments, the light-emitting elements 130 includes a first light-emitting element 131 and a second light-emitting element 132.

The light-shielding part 600 is located at a side of the light-emitting region 310 of the first light-emitting element 131 close to the second light-emitting element 132.

With such a design, the light emitted by the light-emitting region of the first light-emitting element can be blocked by the light-shielding part, thereby preventing the light-emitting region of the first light-emitting element from emitting crosstalk light toward the pixel where the second light-emitting element is located.

In some embodiments, regarding the light-emitting region 310 and the non-light-emitting region 320 corresponding to the first light-emitting element 131, the non-light-emitting region 320 is located at a side of the light-emitting region 310 close to the second light-emitting element. In this way, since transmittance of a material is related to thickness of the material (i.e., its size in a direction of light propagation), with the design for the first light-emitting element, the light-emitting region of the first light-emitting element can be kept as far as possible from the pixel corresponding to the second light-emitting element, so as to provide a space for satisfying a size of the light-shielding part 600 to provide a light-blocking effect.

In some embodiments, the first light-emitting element and the second light-emitting element have the same color.

In some embodiments, the color of the first light-emitting element is the same as a color of a pixel corresponding to the first light-emitting element, and the color of the second light-emitting element is different from a color of a pixel corresponding to the second light-emitting element.

In some embodiments, there is no color conversion layer for the pixel sp corresponding to the color of the first light-emitting element; there is a color conversion layer for the pixel sp corresponding to the color of the second light-emitting element. For example, the first light-emitting element corresponds to a green pixel or a red pixel, and the second light-emitting element corresponds to a blue pixel.

With the embodiment, even if there is a gap between the bottom of the barrier wall and the array substrate, since at a side of the light-emitting region of the first light-emitting element 131 facing the pixel corresponding to the second light-emitting element, there are both the non-light-emitting region of the first light-emitting element 131 and the barrier wall as well as the light-shielding part, the first light-emitting element 131 can be prevented from emitting interfering light toward the pixel where the second light-emitting element 132 is located on the possible light-emitting paths of the first light-emitting element 131.

In some other embodiments of the present application, please refer to the drawings of the embodiments having a support part or a light-shielding part in the present application.

In some embodiments, the support part 700 or the light-shielding part 600 may be a conductive part for electrically connecting the light-emitting element 130 and the array substrate 120. In some embodiments, the conductive part may include a eutectic layer.

Specifically, the array substrate is provided with a connection electrode which is connected to the pixel circuit. Generally, the connection electrode is a metal electrode. The metal electrode is arranged on the outermost layer of the array substrate or exposed by the insulating layer of the array substrate, so as to be in contact with and connected with the electrode layer of the light-emitting element over the array substrate. In some embodiments, the metal electrode on the array substrate may be melted to form a eutectic structure (also called as a eutectic layer) together with the electrode layer of the light-emitting element, so as to realize the electrical connection between the light-emitting element and the array substrate (and pixel circuits therein).

Certainly, in some other embodiments of the present application, the conductive part may include the connection electrode on the array substrate, the electrode layer of the light-emitting element and the eutectic layer formed by them.

With such a design, on one hand, it not only can avoid pressure on the conductive part which is electrically connected between the light-emitting element and the array substrate caused by addition of any other structure on the conductive part and avoid occupation of a space in other areas, but also can avoid obstruction for the connection between the light-emitting element and the array substrate caused by additionally provided support part or light-shielding part. For example, the light-emitting element and the array substrate could not be connected via the conductive part if there is a too large gap between the light-emitting element and the array substrate after they are separated by the support part or the light-shielding part, which is caused by deviation between the height of the support part and the height of the light-shielding part due to errors. On the other hand, a manufacturing process for the display panel can be simplified and cost for the display panel can be reduced; and further, the number of layers of the display panel can be reduced to avoid excessively increased thickness of the display panel.

In some embodiments, the support part and the light-shielding part may be exchangeable structures.

That is, in some embodiments of the present application, the support part may function as the light-shielding part.

Further, in some other embodiments of the present application, the support part may function as the light-shielding part, and meanwhile, function as the conductive part for implementing the electrical connection between the light-emitting element and the array substrate.

Figure 9:
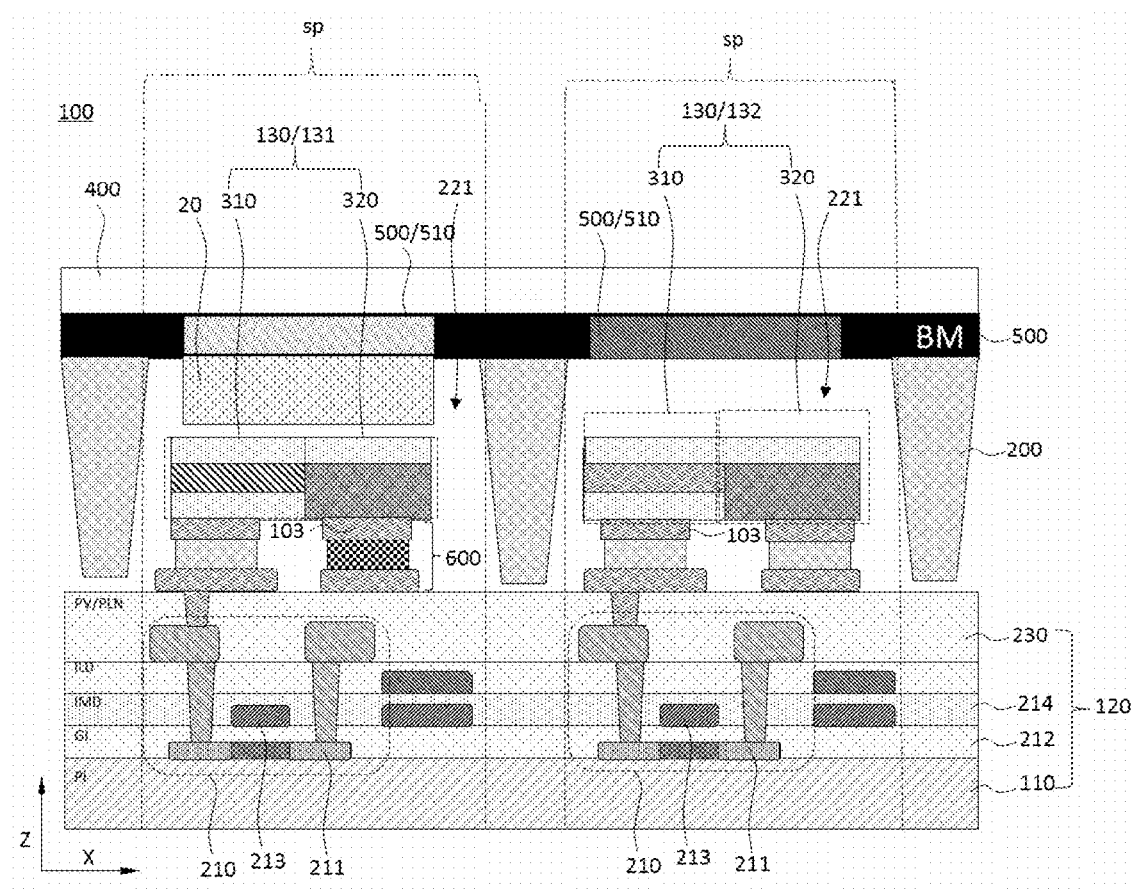
FIG. 9 is another partial cross-sectional view of a display panel according to an embodiment of the present application along the direction A-A in FIG. 1.

As shown in FIG. 9, FIG. 9 is another partial cross-sectional view of a display panel according to an embodiment of the present application along the direction A-A in FIG. 1.

In some embodiments, the light-shielding part 600 may function as a conductive part for electrically connecting the light-emitting element 130 and the array substrate 120. In some embodiments, the conductive part 700 may include a eutectic layer.

Figure 10:
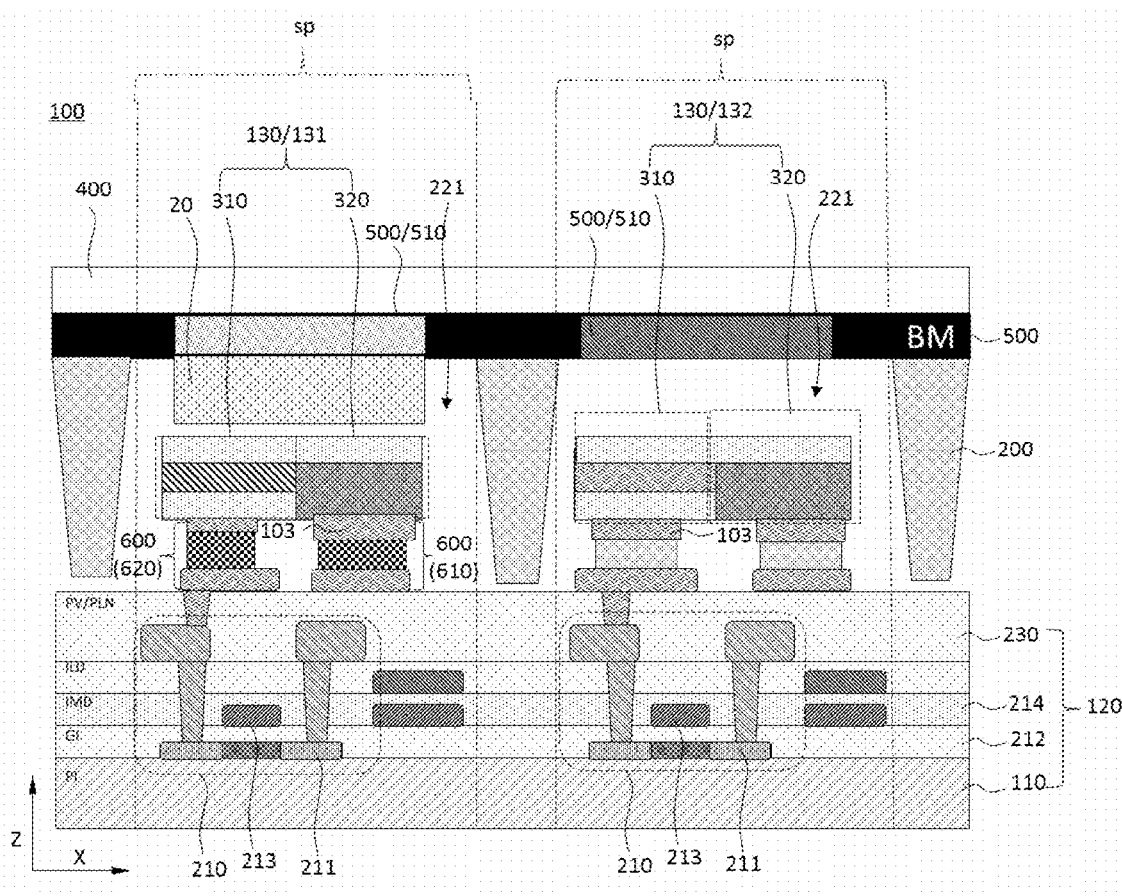
FIG. 10 is another partial cross-sectional view of a display panel according to an embodiment of the present application along the direction A-A in FIG. 1.

As shown in FIG. 10, FIG. 10 is another partial cross-sectional view of a display panel according to an embodiment of the present application along the direction A-A in FIG. 1.

In some embodiments, the display panel 100 further includes a light-shielding part 600 which is located between the light-emitting element 130 and the array substrate 130.

In some embodiments, the light-shielding part 600 may be made of a light-shielding metal material or a black material.

In some embodiments, the light-shielding part 600 may include a first light-shielding part 610 and a second light-shielding part 620.

In some embodiments, a group of light-shielding parts 600 includes at least one first light-shielding part 610 and at least one second light-shielding part 620. At least one light-emitting element 130 (e.g., the first light-emitting element 131) corresponds to a group of the first light-shielding part 610 and the second light-shielding part 620.

In some embodiments, the first light-shielding part 610 and the second light-shielding part 620 in the group of light-shielding parts 600 are arranged along the first direction X, for example, the first light-shielding part 610 and the second light-shielding part 620 in the group of light-shielding parts 600 are located at both ends of the light-emitting element in the first direction X, respectively. The first direction X is consistent with the arrangement direction of the light-emitting region 310 and the non-light-emitting region 320 of the first light-emitting element 131.

In some embodiments, in the light-shielding part 600 corresponding to the first light-emitting element 131, the first light-shielding part 610 is located at a side of the second light-shielding part 620 close to the second light-emitting element 132, and the first light-shielding part 610 has a size larger than that of the second light-shielding part 620.

With the embodiment, two light-shielding parts are provided for the first light-emitting element and arrangement of the light-emitting region and the non-light-emitting region of the first light-emitting element is designed by considering the two types of light-shielding parts with different sizes, it not only can prevent the first light-emitting element from emitting interfering light toward a pixel where the second light-emitting element is located, but also can avoid, when the light-emitting region and the non-light-emitting region of the first light-emitting element are set to have different distances from adjacent pixels at both sides in the first direction to meet the above-mentioned requirements, an excessive difference in crosstalk caused by the first light-emitting element to the pixels.

It should be noted that in some cases, the size of the light-shielding part described in the embodiment may also include the length of the light-shielding part in the first direction X, so that the thickness of the light-shielding part in the direction of light propagation is increasable to improve a light-shielding ability.

Figure 11:
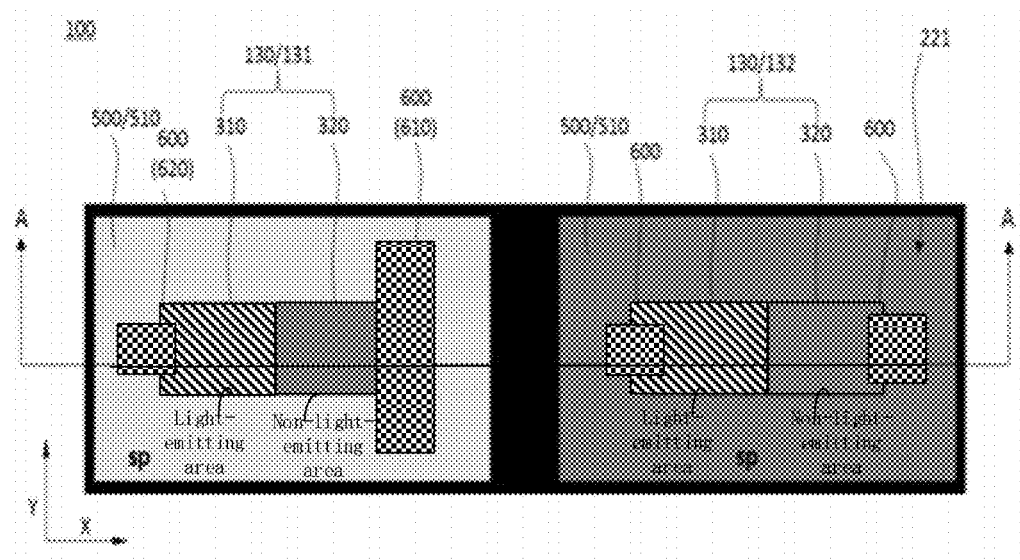
FIG. 11 is a partial bottom view of a display panel according to an embodiment of the present application.
Figure 12:
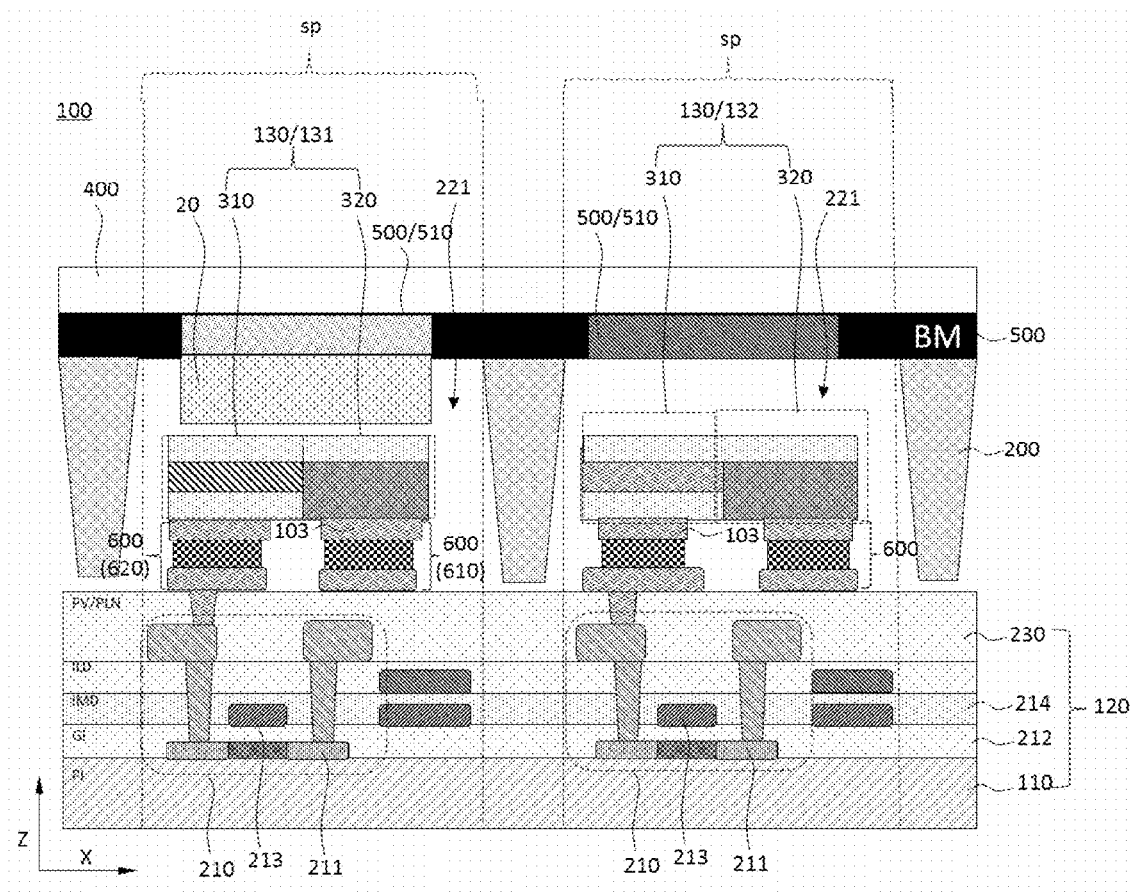
FIG. 12 is a partial cross-sectional view of a display panel according to an embodiment of the present application along a direction A-A in FIG. 11.

Certainly, in some other embodiments of the present application, as shown in FIG. 11 and FIG. 12, FIG. 11 is a partial bottom view of a display panel according to an embodiment of the present application (that is, viewed from the array substrate to the opposite substrate), and FIG. 12 is a partial cross-sectional view of a display panel according to an embodiment of the present application along the direction A-A in FIG. 11, where the cross-section is perpendicular to a plane where the display panel is located. In order to highlight key points and make them easier to understand, some structures are omitted from FIG. 11, for example, the array substrate is not shown; and the same aspects of the embodiment as those in the foregoing embodiments will not be repeated. As described above, the size of the light-shielding part 600 includes the length of the light-shielding part in the second direction Y, that is, in the light-shielding part 600 corresponding to the first light-emitting element 131, the length of the first light-shielding part 610 in the second direction Y is greater than the length of the second light-shielding part 620 in the second direction Y.

The second direction Y intersects (optionally, is perpendicular to) the first direction X and both of them are parallel to the plane where the display panel is located. With the embodiment, oblique outgoing light from the first light-emitting element toward the pixel corresponding to the second light-emitting element (i.e., the outgoing light emitted from the first light-emitting element toward the second light-emitting element which is parallel to the plane where the display panel is located but is not parallel to the first direction) can be blocked by the second light-shielding part.

In some cases, the size of the light-shielding part described in this embodiment may further include the thickness of the light-shielding part in a direction perpendicular to the plane where the display panel is located. The inventors of the present application have further studied and found that after a pixel is turned on, the light emitted by the light-emitting element in the pixel easily cause crosstalk to adjacent pixels through the gap between the bottom of the barrier wall and the array substrate. Thus, the increased thickness of the light-shielding part in the direction perpendicular to the plane where the display panel is located can further prevent the light-emitting region of the first light-emitting element from emitting crosstalk light toward the pixel where the second light-emitting element is located.

Certainly, in some other embodiments of the present application, the area of the first light-shielding part 610 (i.e. the area projected on the plane where the display panel is located) is larger than the area of the second light-shielding part 620. Alternatively, the volume of the first light-shielding part 610 is larger than the volume of the second light-shielding part 620.

In some embodiments, the first light-shielding part 610 may overlap with a projection of the light-emitting region 310 in a direction perpendicular to a plane where the display panel is located, and the second light-shielding part 620 may overlap with a projection of the non-light-emitting region 320 in a direction perpendicular to the plane where the display panel is located.

In some embodiments, each of the first light-shielding part 610 and the second light-shielding part 620 may additionally function as a conductive part for electrically connecting the light-emitting element and the array substrate, and the conductive part may include a eutectic layer. For example, the first light-shielding part 610 and the second light-shielding part 620 correspond to a first electrode and a second electrode in the electrode layer 103 of the light-emitting element, respectively.

Figure 13:
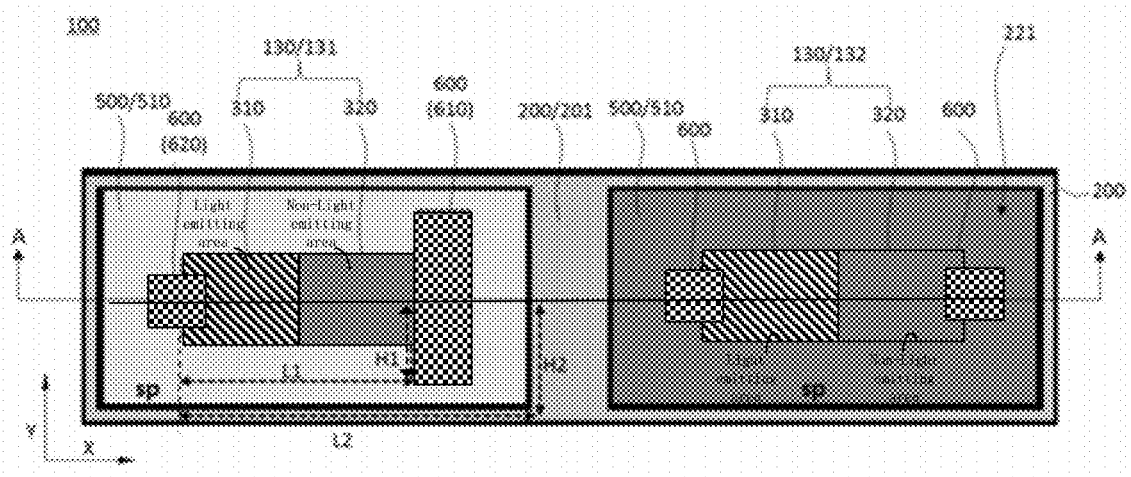
FIG. 13 is a partial bottom view of a display panel according to an embodiment of the present application.

As shown in FIG. 13, FIG. 13 is a partial bottom view of a display panel according to an embodiment of the present application.

In some embodiments, the display panel 100 further includes a light-shielding part 600 which is located between the light-emitting element 130 and the array substrate 130.

In some embodiments, the light-shielding part 600 may be made of a light-shielding metal material or a black material.

In some embodiments, the light-emitting element 130 includes a first light-emitting element 131 and a second light-emitting element 132.

The light-shielding part 600 is located at a side of the light-emitting region 310 of the first light-emitting element 131 close to the second light-emitting element 132.

In some embodiments, the first light-emitting element 131 and the second light-emitting element 132 are arranged along the first direction X. That is, along the first direction X, the pixel sp corresponding to the first light-emitting element 131 and the pixel sp corresponding to the second light-emitting element 132 are disposed adjacent to each other.

In some embodiments, the display panel 100 further includes barrier walls 200 among the light-emitting elements 130. For details of the barrier wall in the embodiment, please refer to other embodiments including a barrier wall in the application, and thus they will not be repeated here.

In some embodiments, the barrier walls 200 includes a first barrier wall 201 located between the first light-emitting element 131 and the second light-emitting element 132, and the first barrier wall 201 extends along the second direction Y. The second direction Y intersects (optionally, is perpendicular to) the first direction X and both of them are parallel to a plane where the display panel 100 is located.

In some embodiments, along the first direction X: a distance from the light-emitting region 310 of the first light-emitting element 131 to the light-shielding part 600 is L1, and a distance from the light-emitting region 310 of the first light-emitting element 131 to the first barrier wall 201 is L2. It should be noted that the "distance" here refers to a distance component in the first direction X, that is, the distance therebetween refers to a difference of coordinates of their positions in a coordinate axis parallel to the first direction X.

Along the second direction Y: a distance from the light-emitting region 310 of the first light-emitting element 131 to the light-shielding part 600 is H1, and a distance from the light-emitting region 310 of the first light-emitting element 131 to the first barrier wall 201 is H2. It should be noted that the "distance" here refers to a distance component in the second direction Y, that is, the distance therebetween refers to a difference of coordinates of their positions in a coordinate axis parallel to the second direction X.

In some embodiments, H1>(L1*H2)/L2.

In some embodiments, the light-shielding part 600 may be the first light-shielding part 610 as discussed in other embodiments.

In some embodiments, the length of the light-shielding part 600 in the second direction Y is greater than or equal to 2*H1.

It should be noted that the position in the light-emitting region for measuring the two distances (L1, L2) may be at an end of the light-emitting region 310 of the first light-emitting element 131 away from the second light-emitting element 132. The position in the light-shielding part 600 or the first barrier wall 201 for measuring the two distances (L1, L2) may be at an end of the light-shielding part 600 or the first barrier wall 201 away from the second light-emitting element. For example, along the first direction X, the distance from the light-emitting region 310 of the first light-emitting element 131 to the light-shielding part 600 is a distance from the end of the light-emitting region 310 of the first light-emitting element 131 far away from the second light-emitting element 132 to the end of the light-shielding part 600 away from the second light-emitting element 132. As another example, along the first direction X, the distance from the light-emitting region 310 of the first light-emitting element 131 to the first barrier wall 201 is a distance from the end of the light-emitting region 310 of the first light-emitting element 131 away from the second light-emitting element 132 to the end of the first barrier wall 201 away from the second light-emitting element 132.

It should be understood the embodiments are described by way of the examples, but are not limited to these specific examples. For example, the position in the light-emitting region for measuring the two distances (L1, L2) may be ay an end of the light-emitting region 310 of the first light-emitting element 131 near to the second light-emitting element 132, and the position in the light-shielding part 600 or the first barrier wall 201 for measuring the two distances (L1, L2) may be at an end of the light-shielding part 600 or the first barrier wall 201 near to the second light-emitting element 132.

It also should be noted that the position in the light-emitting region for measuring the two distances (H1, H2) may be at a center point of the light-emitting region 310 of the first light-emitting element 131 in the second direction, and the position in the light-shielding part 600 or the first barrier wall 201 for measuring the two distances (H1, H2) may be at one of ends (a lower end or an upper end) of the light-shielding part 600 or the first barrier wall 201 in the second direction. For example, along the second direction X, the distance from the light-emitting region 310 of the first light-emitting element 131 to the light-shielding part 600 is a distance from the center point of the light-emitting region 310 of the first light-emitting element 131 to one (e.g. a lower end, as shown in the figure) of ends of the light-shielding part 600. As another example, along the second direction X, the distance from the light-emitting region 310 of the first light-emitting element 131 to the first barrier wall 201 is a distance from the center point of the light-emitting region 310 of the first light-emitting element 131 to one (e.g. a lower end, as shown in the figure) of ends of the first barrier wall 201.

It should be understood the embodiments are described by way of the examples, but are not limited to these specific examples. For example, the position in the light-emitting region for measuring the two distances (H1, H2) may be either one of ends of the light-emitting region 310 of the first light-emitting element 131 in the second direction.

With the embodiment, by setting the size of the light-shielding part which is disposed far away from the light-emitting region of the first light-emitting element in the second direction such that a connection line between an edge of the light-emitting region of the first light-emitting element and an edge of the light-shielding part just passes through a point at an edge of the pixel corresponding to the second light-emitting element or through an area other than the pixel corresponding to the second light-emitting element and does not pass through the pixel corresponding to the second light-emitting element (it can also be understood as an area of an opening between the barrier walls corresponding to the pixel), light leakage can further be prevented to enter the second light-emitting element, and thus the display effect can be improved.

Figure 14:
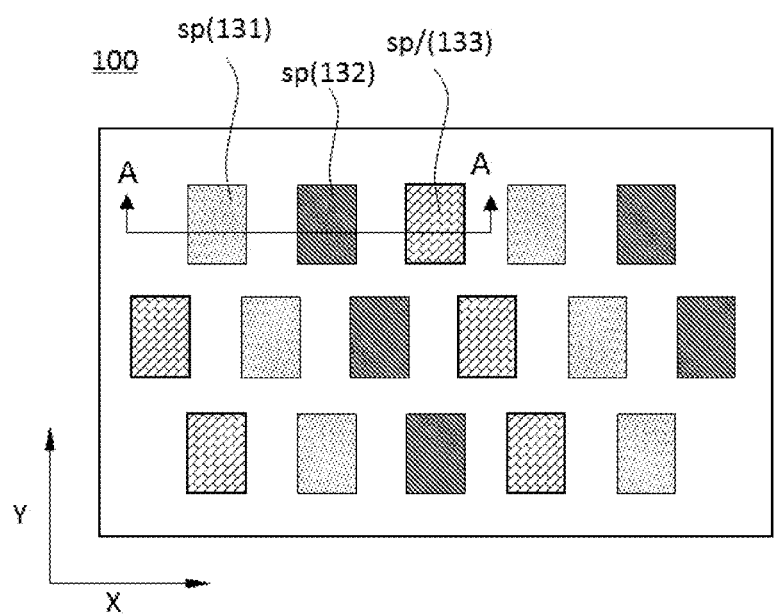
FIG. 14 is a partial top view of a display panel according to an embodiment of the present application.
Figure 15:
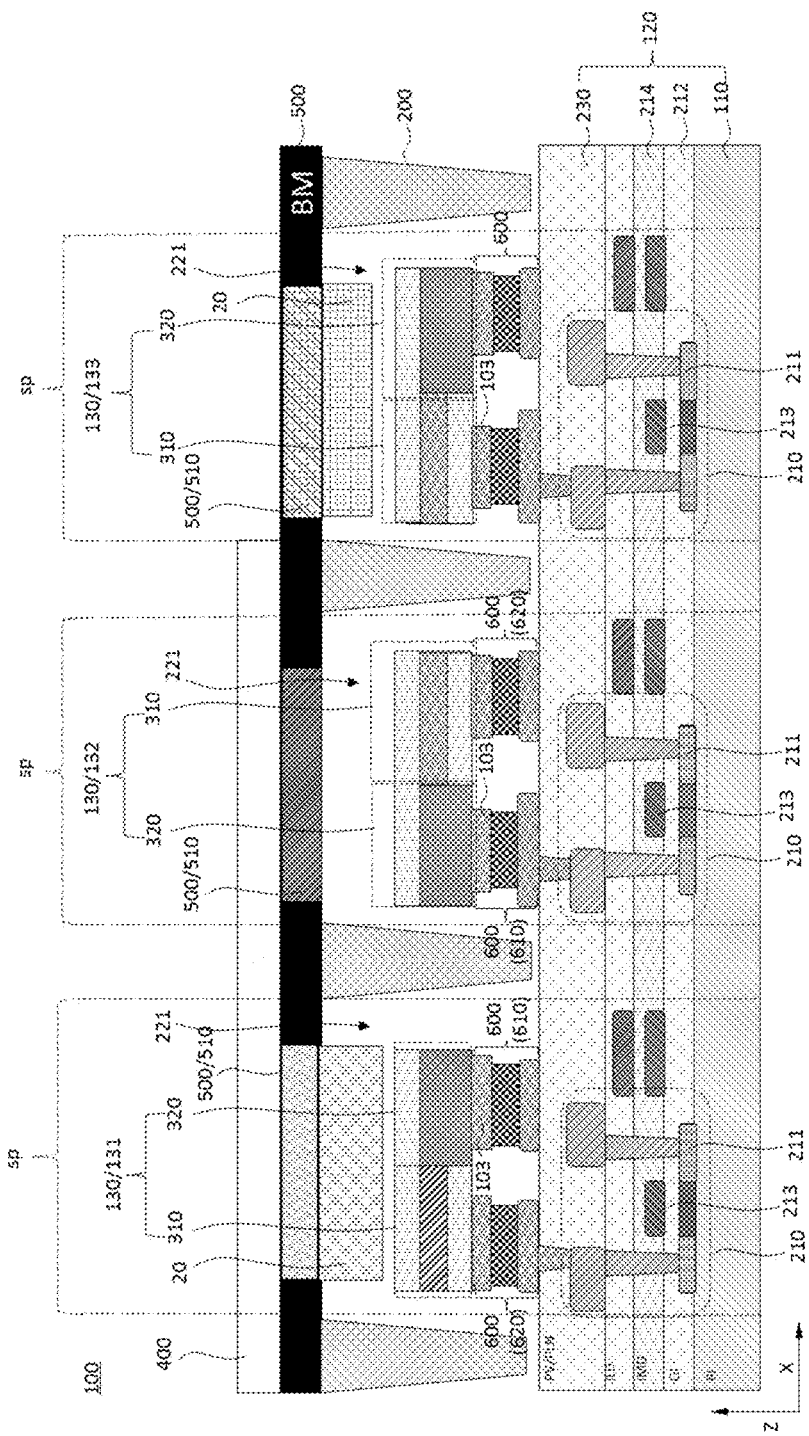
FIG. 15 is a partial cross-sectional view of a display panel according to an embodiment of the present application along a direction A-A in FIG. 14.

As shown in FIGS. 14 and 15, FIG. 14 is a partial top view of a display panel according to an embodiment of the present application, and FIG. 15 is a partial cross-sectional view of the display panel according to the embodiment of the present application along the direction A-A in FIG. 14, where the cross section is perpendicular to the plane where the display panel is located. The aspects of the embodiment which are the same as those in the foregoing embodiments will not be repeated.

In some embodiments, the light-emitting elements 130 further include a third light-emitting element 133. The second light-emitting element 132 is located between the first light-emitting element 131 and the third light-emitting element 133.

In some embodiments, the display panel includes pixels arranged in an array, and pixels of three different colors are sequentially and cyclically arranged in the first direction X. The light-emitting elements corresponding to the pixels of the three different colors are the first light-emitting element 131, the second light-emitting element 132, and the third light-emitting element 133, respectively. Therefore, along the first direction X, the first light-emitting element 131, the second light-emitting element 132, and the third light-emitting element 133 are sequentially and cyclically arranged.

In some embodiments, a distance from the light-emitting region of the second light-emitting element to the third light-emitting element is smaller than a distance from the light-emitting region of the second light-emitting element to the first light-emitting element.

That is, in the first direction X, the second light-emitting element 132 is located between the first light-emitting element 131 and the third light-emitting element 133, the light-emitting region 310 and the non-light-emitting region 320 of the second light-emitting element 132 are arranged along the first direction X, the light-emitting region 310 of the second light-emitting element 132 is located at a side of the non-light-emitting region 320 of the second light-emitting element 132 facing the third light-emitting element 133 which is adjacent to the second light-emitting element 132 in the first direction X, and the non-light-emitting region 320 of the second light-emitting element 132 is close to the first light-emitting element 131.

In some embodiments, a wavelength of light of a pixel sp corresponding to the first light-emitting element 131 is between a wavelength of light of a pixel sp corresponding to the second light-emitting element 132 and a wavelength of light of a pixel sp corresponding to the third light-emitting element 133.

With the embodiment, crosstalk can be further prevented. For example, the first light-emitting element corresponding to a green pixel, the second light-emitting element corresponding to a blue pixel and the third light-emitting element corresponding to a red pixel is taken as an example for description. It is better that the light-emitting region of the light-emitting element of the blue pixel is close to the red pixel, because blue light will not be easily transmitted through a red color resist.

Figure 16:
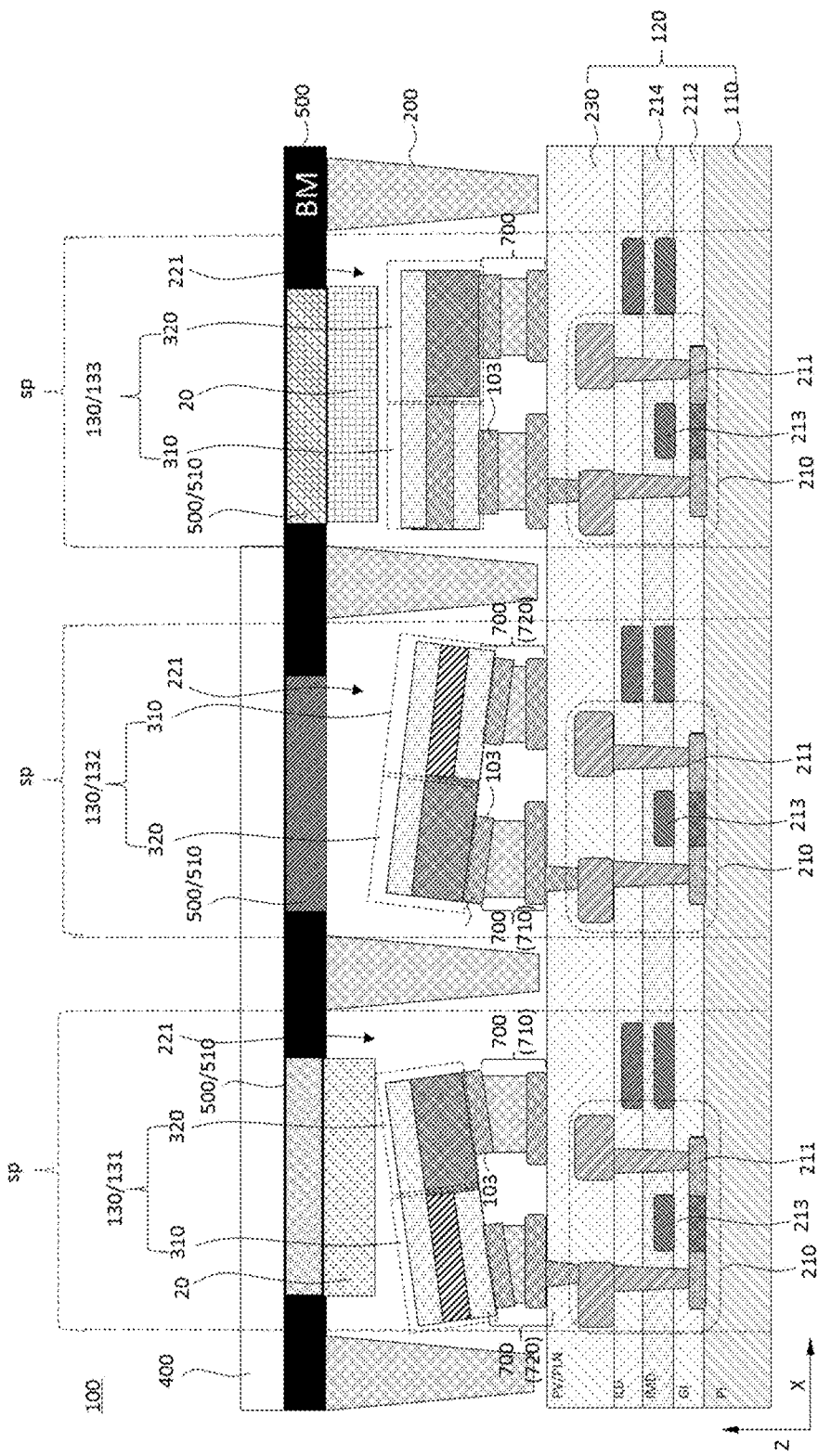
FIG. 16 is another partial cross-sectional view of a display panel according to an embodiment of the present application along the direction A-A in FIG. 14.

As shown in FIG. 16, FIG. 16 is another partial cross-sectional view of the display panel according to the embodiment of the present application along the direction A-A in FIG. 14, where the cross-section is perpendicular to the plane where the display panel is located. The aspects of the embodiment which are the same as those in the foregoing embodiments will not be repeated.

In some embodiments, the arrangement of the second light-emitting element with respect to the first light-emitting element may refer to the arrangement of the first light-emitting element with respect to the second light-emitting element in the foregoing embodiments. For example, the plane where the light-emitting region 310 of the second light-emitting element 132 is located is not parallel to the plane where the display panel 100 is located, and its top surface is inclined such that the top surface is disposed away from the first light-emitting element.

That is, in the direction from the second light-emitting element 132 toward the first light-emitting element 131, the light-emitting region of the second light-emitting element 132 is inclined away from the array substrate 120.

In some embodiments, the first light-emitting element 131 is disposed in a green pixel, and the second light-emitting element 132 corresponds to a blue pixel.

In some embodiments, in a group of support parts 700 corresponding to the second light-emitting element 132: the first supporting part 710 is located at a side of the second support part 720 close to the first light-emitting element 131, and the first support part 710 is higher than the second support part 720.

Certainly, in some other embodiments of the present application, the second light-emitting element or the light-emitting region of the second light-emitting element may be disposed away from the pixel corresponding to the first light-emitting element; or the second light-emitting element or the light-emitting region of the second light-emitting element may be disposed facing the pixel corresponding to the third light-emitting element.

In other words, the arrangement of the second light-emitting element with respect to the first light-emitting element may refer to the arrangement of the first light-emitting element with respect to the second light-emitting element in the foregoing embodiments. That is, the arrangement of the light-emitting region and the non-light-emitting region of the first light-emitting element is symmetric with the arrangement of the light-emitting region and the non-light-emitting region of the second light-emitting element.

Figure 17:
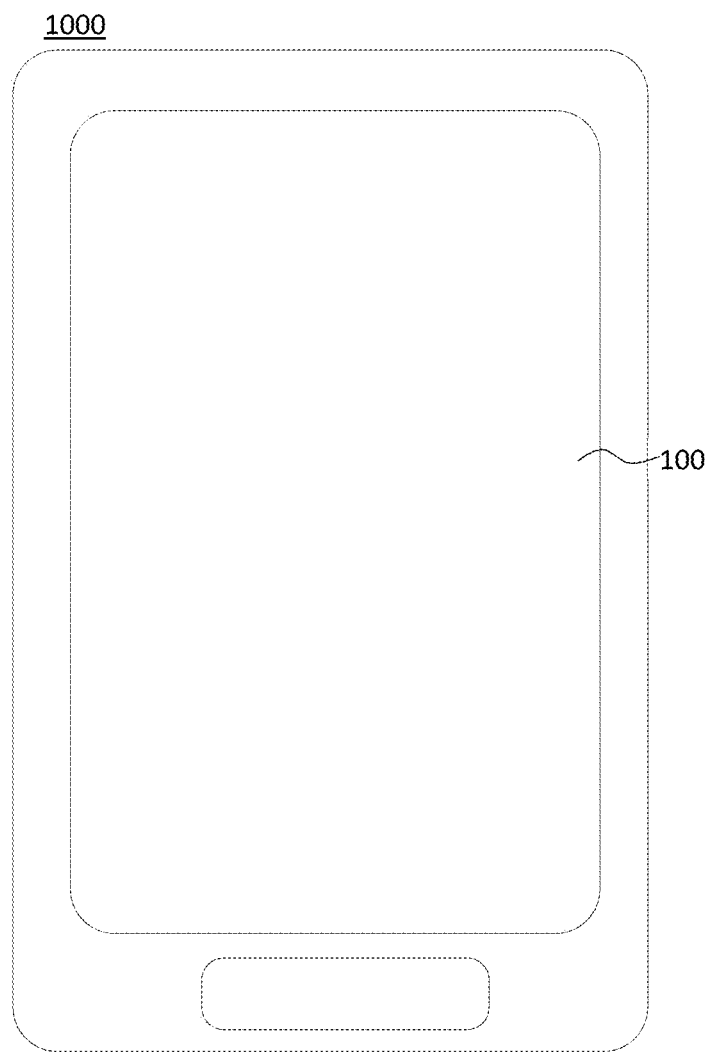
FIG. 17 is a schematic structural diagram of a display device according to an embodiment of the present application.

The present application further provides a display device including the display panel according to the present application. As shown in FIG. 17, FIG. 17 is a schematic structural diagram of a display device according to an embodiment of the present application. The display device 1000 includes the display panel 100 according to any of the foregoing embodiments of the present application. The embodiment of FIG. 17 is provided to describe the display device 1000 by taking only a mobile phone as an example. It should be understood that the display device according to the embodiment of the present application may be a computer, a TV, a vehicle-mounted display device, and other display devices with a display function, which is not specifically limited in the present application. The display device according to the embodiment of the present application attains the same beneficial effects as those of the display panel according to the embodiment of the present application. For details, reference may be made to specific descriptions of the display panel in the foregoing embodiments, and thus they will not be repeated in the embodiment.

The above contents provide detailed descriptions of the present application in combination with specific preferred embodiments, and it should be noted that specific implementations of the present application is not limited to these descriptions. For those skilled in the art to which the present application belongs, some easy deductions or substitutions can be made without departing from concepts of the present application, and all of them should be regarded as being within the protection scope of the present application.

What is claimed is:

1. A display panel, comprising:
   an array substrate; and
   a plurality of pixels, one of the plurality of pixels comprising a light-emitting element;
   wherein the light-emitting element is located at a side of the array substrate and comprises a light-emitting region and a non-light-emitting region; and
   wherein at least two of the light-emitting elements are arranged in such different manners that an arrangement direction in which the light-emitting region is arranged with respect to the non-light-emitting region in one of the at least two light-emitting elements is different from an arrangement direction in which the light-emitting region is arranged with respect to the non-light-emitting region in another of the at least two light-emitting elements.

2. The display panel according to claim 1, wherein the display panel further comprises a color conversion layer, which is located at a side of the light-emitting element away from the array substrate.

3. The display panel according to claim 2, wherein the light-emitting elements are light-emitting elements for emitting light of first color, and the color conversion layer corresponding to one pixel of the plurality of pixel is configured to convert the light of first color into light of a color corresponding to the pixel.

4. The display panel according to claim 1, wherein a space between two light-emitting elements of the at least two light-emitting elements in a first direction is larger or smaller than a space between the light-emitting regions of the two light-emitting elements in the first direction.

5. The display panel according to claim 1, wherein the light-emitting elements include a first light-emitting element and a second light-emitting element;
   a distance from the light-emitting region of the first light-emitting element to the second light-emitting element is D1; and a distance from the non-light-emitting region of the first light-emitting element to the second light-emitting element is D2;
where D1>D2.

6. The display panel according to claim 1, wherein the display panel further includes a light-shielding part which is located between the light-emitting element and the array substrate,
the light-emitting elements include a first light-emitting element and a second light-emitting element;
the light-shielding part is located at a side of the light-emitting region of the first light-emitting element close to the second light-emitting element.

7. The display panel according to claim 1, wherein the light-emitting elements include a first light-emitting element and a second light-emitting element, and
the light-shielding part includes a first light-shielding part and a second light-shielding part, and in the light-shielding part corresponding to the first light-emitting element, the first light-shielding part is located at a side of the second light-shielding part close to the second light-emitting element, and the first light-shielding part has a size larger than that of the second light-shielding part.

8. The display panel according to claim 1, wherein the light-emitting elements include a first light-emitting element and a second light-emitting element, a color of the first light-emitting element is different from a color of a first pixel of the plurality of pixels corresponding the first light-emitting element, and a color of the second light-emitting element is the same as a color of a second pixel of the plurality of pixels corresponding the second light-emitting element.

9. The display panel according to claim 1, wherein the first light-emitting element and the second light-emitting element are arranged along a first direction, the barrier walls include a first barrier wall located between the first light-emitting element and the second light-emitting element, and the first barrier wall extends along a second direction,
along the first direction: a distance from the light-emitting region of the first light-emitting element to the light-shielding part is L1, and a distance from the light-emitting region of the first light-emitting element to the first barrier wall is L2, and
along the second direction: a distance from the light-emitting region of the first light-emitting element to one of ends the light-shielding part in the second direction is H1, and a distance from the light-emitting region of the first light-emitting element to one of ends of the first barrier wall in the second direction is H2,
where H1> (L1*H2)/L2.

10. The display panel according to claim 1, wherein the light-emitting elements comprise a first light-emitting element, a third light-emitting element, and a second light-emitting element located between the first light-emitting element and the third light-emitting element;
a distance from the light-emitting region of the second light-emitting element to the third light-emitting element is smaller than a distance from the light-emitting region of the second light-emitting element to the first light-emitting element;
a wavelength of light of a first pixel of the plurality of pixels corresponding to the first light-emitting element is between a wavelength of light of a second pixel of the plurality of pixels corresponding to the second light-emitting element and a wavelength of light of a third pixel of the plurality of pixels corresponding to the third light-emitting element.

11. The display panel according to claim 1, wherein the display panel further includes an opposite substrate which is provided opposite to the array substrate, and includes a plurality of barriers walls;
wherein the barrier walls are located at a side of the opposite substrate facing the array substrate, and disposed corresponding to respective intervals among the light-emitting elements.

12. The display panel according to claim 1, wherein the display panel further includes a color filter layer,
wherein the color filter layer is disposed corresponding to the light-emitting elements.

13. A display device, comprising a display panel,
wherein the display panel comprises an array substrate and a plurality of pixels, one of the plurality of pixels comprising a light-emitting element;
the light-emitting element is located at a side of the array substrate and comprises a light-emitting region and a non-light-emitting region; and
at least two of the light-emitting elements are arranged in such different manners that an arrangement direction in which the light-emitting region is arranged with respect to the non-light-emitting region in one of the at least two light-emitting elements is different from an arrangement direction in which the light-emitting region is arranged with respect to the non-light-emitting region in another of the at least two light-emitting elements.

14. The display panel according to claim 6, wherein the light-shielding part additionally functions as a conductive part for electrically connecting the light-emitting element and the array substrate.

15. The display panel according to claim 7, wherein the light-shielding part additionally functions as a conductive part for electrically connecting the light-emitting element and the array substrate.

* * * * *